US010930633B2

(12) United States Patent
Chen et al.

(10) Patent No.: US 10,930,633 B2
(45) Date of Patent: Feb. 23, 2021

(54) BUFFER DESIGN FOR PACKAGE INTEGRATION

(71) Applicant: Taiwan Semiconductor Manufacturing Company, Ltd., Hsinchu (TW)

(72) Inventors: Jie Chen, New Taipei (TW); Hsien-Wei Chen, Hsinchu (TW); Ming-Fa Chen, Taichung (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/120,752

(22) Filed: Sep. 4, 2018

(65) Prior Publication Data

US 2020/0006309 A1    Jan. 2, 2020

Related U.S. Application Data

(60) Provisional application No. 62/691,989, filed on Jun. 29, 2018.

(51) Int. Cl.
*H01L 23/00* (2006.01)
*H01L 25/00* (2006.01)
*H01L 25/065* (2006.01)
*H01L 25/10* (2006.01)
*H01L 25/18* (2006.01)
(Continued)

(52) U.S. Cl.
CPC ............ *H01L 25/50* (2013.01); *H01L 21/481* (2013.01); *H01L 21/4853* (2013.01); *H01L 21/56* (2013.01); *H01L 25/0655* (2013.01); *H01L 25/105* (2013.01); *H01L 25/18* (2013.01);
(Continued)

(58) Field of Classification Search
CPC . H01L 21/76898; H01L 21/56; H01L 21/481; H01L 21/48153; H01L 25/105; H01L 25/18; H01L 25/0655; H01L 25/50
See application file for complete search history.

(56) References Cited

U.S. PATENT DOCUMENTS 9,831,224 B2    11/2017    Lin et al.
10,032,746 B2    7/2018    Chen
(Continued)

FOREIGN PATENT DOCUMENTS

CN    104900598 A    9/2015
CN    105789147 A    7/2016
(Continued)

*Primary Examiner* — Hoa B Trinh
(74) *Attorney, Agent, or Firm* — Slater Matsil, LLP

(57) ABSTRACT

A method of forming a package includes bonding a device die to an interposer wafer, with the interposer wafer including metal lines and vias, forming a dielectric region to encircle the device die, and forming a through-via to penetrate through the dielectric region. The through-via is electrically connected to the device die through the metal lines and the vias in the interposer wafer. The method further includes forming a polymer layer over the dielectric region, and forming an electrical connector. The electrical connector is electrically coupled to the through-via through a conductive feature in the polymer layer. The interposer wafer is sawed to separate the package from other packages.

20 Claims, 22 Drawing Sheets

(51) Int. Cl.
*H01L 21/48* (2006.01)
*H01L 21/56* (2006.01)

(52) U.S. Cl.
CPC ............... *H01L 2225/1035* (2013.01); *H01L 2225/1041* (2013.01); *H01L 2225/1058* (2013.01)

(56) References Cited

U.S. PATENT DOCUMENTS

| | | |
|---|---|---|
| 2012/0104624 A1 | 5/2012 | Choi et al. |
| 2014/0252594 A1* | 9/2014 | Meng ............... H01L 21/6835 257/737 |
| 2015/0255432 A1 | 9/2015 | Lin et al. |
| 2015/0262909 A1 | 9/2015 | Chen |
| 2016/0300817 A1* | 10/2016 | Do ............... H01L 25/50 |
| 2016/0307778 A1* | 10/2016 | Lin ............... H01L 24/19 |
| 2016/0315071 A1* | 10/2016 | Zhai ............... H01L 24/19 |
| 2017/0194290 A1* | 7/2017 | Yu ............... H01L 21/565 |
| 2018/0138225 A1 | 5/2018 | Kim et al. |

FOREIGN PATENT DOCUMENTS

| | | |
|---|---|---|
| KR | 20150105183 A | 9/2015 |
| KR | 20150106815 A | 9/2015 |
| KR | 20180054019 A | 5/2018 |

\* cited by examiner

BUFFER DESIGN FOR PACKAGE INTEGRATION

PRIORITY CLAIM AND CROSS-REFERENCE

This application claims the benefit of the following provisionally filed U.S. patent application: Application Ser. No. 62/691,989, filed Jun. 29, 2018, and entitled "Buffer Design for INFO Package System Integration," which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
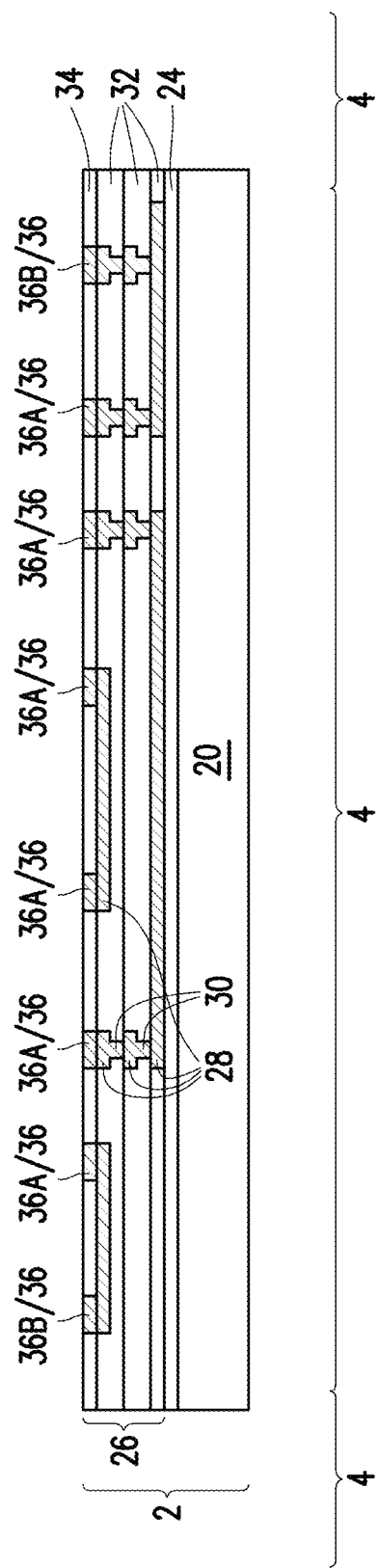
FIGS. 1 through 12 are cross-sectional views of intermediate stages in the formation of a System on Integrate Chip (SoIC) package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 80 degrees or at other orientations) and the spatially relative descriptors used herein may likewise be interpreted accordingly.

An integrated package including a System on Integrate Chip (SoIC) package bonded to an Integrated Fan-Out (InFO) package and the method of forming the same are provided in accordance with various embodiments. The intermediate stages of forming the packages are illustrated in accordance with some embodiments. Some variations of some embodiments are discussed. Throughout the various views and illustrative embodiments, like reference numbers are used to designate like elements.

FIGS. 1 through 12 illustrate the cross-sectional views of intermediate stages in the formation of a SoIC package in accordance with some embodiments of the present disclosure. The steps shown in FIGS. 1 through 12 are also reflected schematically in the process flow 200 shown in FIG. 17.

FIG. 1 illustrates the cross-sectional view in the formation of wafer 2. In accordance with some embodiments of the present disclosure, wafer 2 is an interposer wafer, which is free from any active devices such as transistors and/or diodes therein. In accordance with some embodiments of the present disclosure, interposer wafer 2 is also free from passive devices such as capacitors, inductors, resistors, or the like therein. Interposer wafer 2 may include a plurality of metal lines and vias therein, with some details of one of interposer dies 4 illustrated schematically. Interposer dies 4 are alternatively referred to as interposers or chips hereinafter. Interposer dies 4 are used for routing, as will be discussed in subsequent paragraphs.

Wafer 2 may include substrate 20 and the features over the top surface of substrate 20. In accordance with some embodiments of the present disclosure, substrate 20 is a semiconductor substrate. The substrate 20 may be formed of crystalline silicon, crystalline germanium, crystalline silicon germanium, and/or a III-V compound semiconductor such as GaAsP, AlInAs, AlGaAs, GaInAs, GaInP, GaInAsP, or the like. Semiconductor substrate 20 may also be a bulk silicon substrate or a Silicon-On-Insulator (SOI) substrate. In accordance with some embodiments in which the substrate 20 is a semiconductor substrate, Shallow Trench Isolation (STI) regions (not shown) may be formed in substrate 20 to isolate the regions in substrate 20. In accordance with alternative embodiments, STI regions are not formed in wafer 2 since wafer 2 does not have active devices, and hence does not need STI regions to isolation active regions from each other. Substrate 20 may also be a dielectric substrate, which may be formed of silicon oxide, for example. In accordance with some embodiments, through-vias (not shown) are formed to extend into semiconductor substrate 20, wherein the through-vias are used to electrically inter-couple the features on opposite sides of substrate 20. In accordance with alternative embodiments, no through-vias are formed extending into semiconductor substrate 20.

Dielectric layer 24 may be formed over substrate 20. In accordance with some embodiments of the present disclosure, dielectric layer 24 is an Inter-Layer Dielectric (ILD), which may be formed of silicon oxide, Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS), or the like. Dielectric layer 24 may be formed using thermal oxidation, spin coating, Flowable Chemical Vapor Deposition (FCVD), Atomic Layer Deposition (ALD), Chemical Vapor Deposition (CVD), Plasma Enhanced Chemical Vapor Deposition (PECVD), Low Pressure Chemical Vapor Deposition (LPCVD), or the like.

Over dielectric layer 24 resides interconnect structure 26. Interconnect structure 26 includes metal lines 28 and vias 30, which are formed in dielectric layers 32. Dielectric layers 32 are alternatively referred to as Inter-Metal Dielectric (IMD) layers hereinafter. In accordance with some embodiments of the present disclosure, dielectric layers 32 are formed of low-k dielectric materials having dielectric constants (k-values) lower than 3.8. For example, the k values of dielectric layers 32 may be lower about 3.0 or lower than about 2.5. Dielectric layers 32 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 32 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 32 includes depositing a porogen-containing dielectric material, and then performing a curing process to drive out the porogen, and hence the remaining dielectric layers 32 is porous. Etch stop layers (not shown), which may be formed of silicon carbide, silicon nitride, or the like, are formed between IMD layers 32, and are not shown for simplicity.

Metal lines 28 and vias 30 are formed in dielectric layers 32. The metal lines 28 at a same level are collectively referred to as a metal layer hereinafter. In accordance with some embodiments of the present disclosure, interconnect structure 26 includes a plurality of metal layers that are interconnected through vias 30. Metal lines 28 and vias 30 may be formed of copper or copper alloys, and they can also be formed of other metals. The formation process may include single damascene and dual damascene processes. In a single damascene process, a trench is first formed in one of dielectric layers 32, followed by filling the trench with a conductive material. A planarization process such as a CMP process is then performed to remove the excess portions of the conductive material higher than the top surface of the IMD layer, leaving a metal line in the trench. In a dual damascene process, both a trench and a via opening are formed in an IMD layer, with the via opening underlying and in spatial communication with the trench. The conductive material is then filled into the trench and the via opening to form a metal line and a via, respectively. The conductive material may include a diffusion barrier layer lining the trench and the via and a copper-containing metallic material over the diffusion barrier layer. The diffusion barrier layer may include titanium, titanium nitride, tantalum, tantalum nitride, or the like.

FIG. 1 illustrates surface dielectric layer 34 in accordance with some embodiments of the present disclosure. Surface dielectric layer 34 is formed of a non-low-k dielectric material such as silicon oxide. Surface dielectric layer 34 is alternatively referred to as a passivation layer since it has the function of isolating the underlying low-k dielectric layers (if any) from the adverse effect of detrimental chemicals and moisture. Surface dielectric layer 34 may also have a composite structure including more than one layer, which may be formed of silicon oxide, silicon nitride, Undoped Silicate Glass (USG), or the like. Interposer dies 4 may also include metal pads underlying surface dielectric layer 34, and the metal pads may include aluminum or aluminum copper pads, Post-Passivation Interconnect (PPI), or the like, which are not shown for simplicity.

Bond pads 36A and 36B, which are also collectively and individually referred to bond pads 36, are formed in surface dielectric layer 34. In accordance with some embodiments of the present disclosure, bond pads 36A and 36B are formed through a single damascene process, and may also include barrier layers and a copper-containing material formed over the barrier layers. In accordance with alternative embodiments of the present disclosure, bond pads 36A and 36B are formed through a dual damascene process. Some bond pads 36A may be electrically coupled to other bond pads 36A and 36B through metal lines 28 and vias 30. In accordance with some embodiments of the present disclosure, each of bond pads 36A and bond pads 36B is electrically connected to at least one (or more) of other bond pads 36A and 36B through metal lines 28 and vias 30, and none of bond pads 36A and 36B is electrically disconnected to all other bond pads 36A and 36B.

Figure 12:
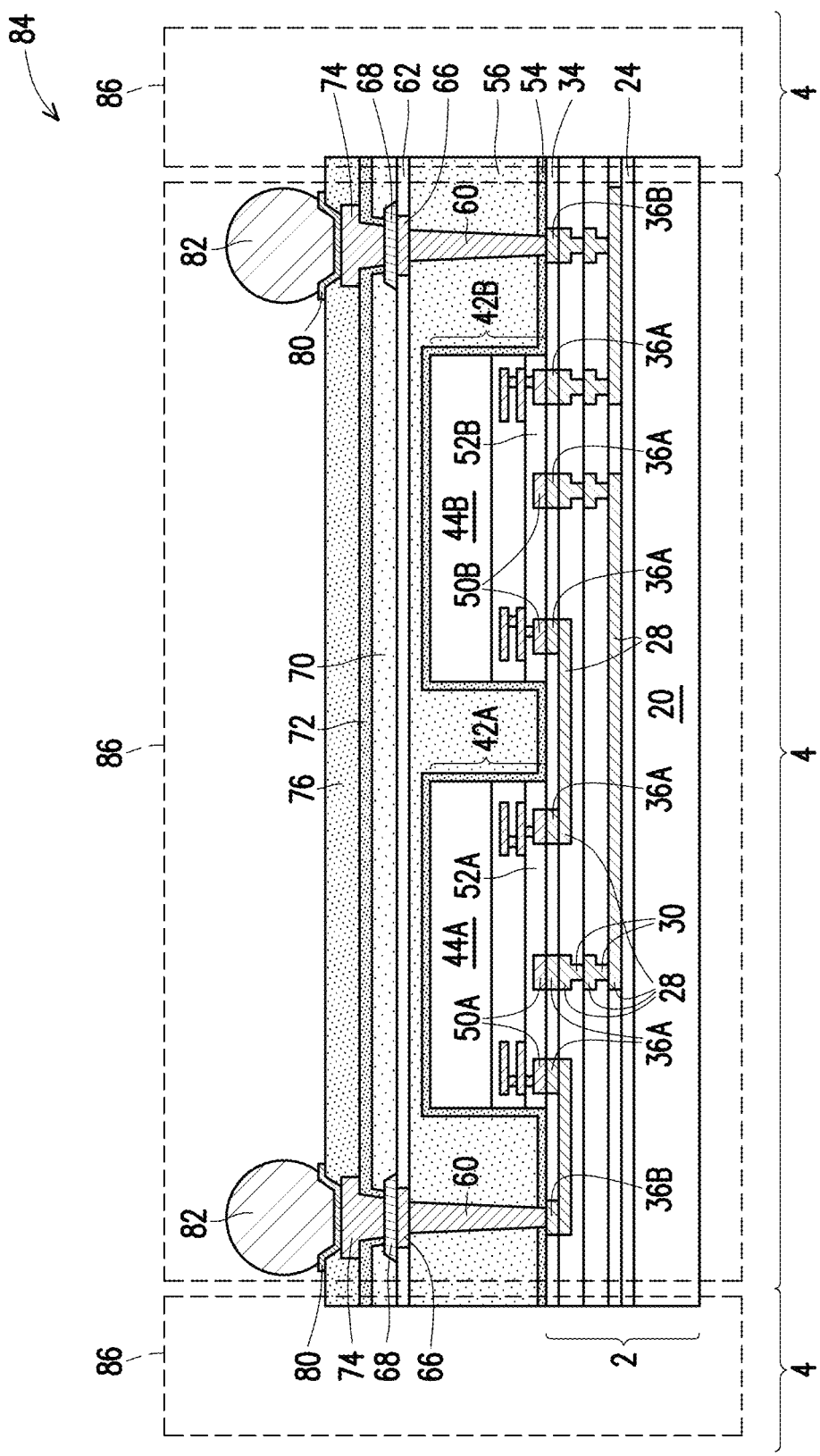

In accordance with some embodiments of the present disclosure, there is no organic dielectric material such as polymer, resin, and molding compound in wafer 2. Organic dielectric layers typically have high Coefficients of Thermal Expansion (CTEs), such as 10 ppm/C.° or higher. This is significantly greater than the CTE of silicon substrate (such as substrate 20), which is about 3 ppm/C.°. Accordingly, organic dielectric layers tend to cause the warpage of wafer 2. Not including organic materials in wafer 2 advantageously reduces the CTE mismatch between the layers in wafer 2, and results in the reduction in the warpage of the resulting SoIC package 86 (FIG. 12). Also, not including organic materials in wafer 2 makes the formation of fine-pitch metal lines (such as 66 in FIG. 12) and high-density bond pads possible, and results in the improvement in the routing ability. The top surface dielectric layer 34 and bond pads 36 are planarized so that their top surfaces are coplanar, which may be resulted due to the CMP in the formation of bond pads 36.

Figure 2:
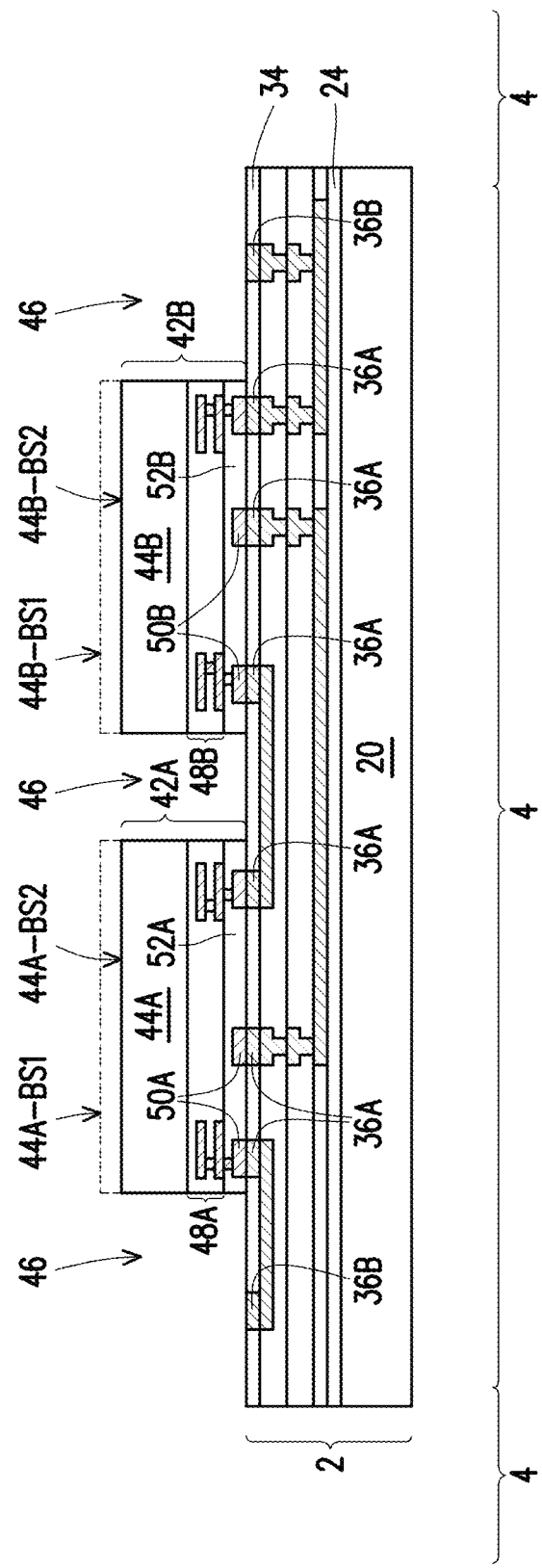
Figure 22:
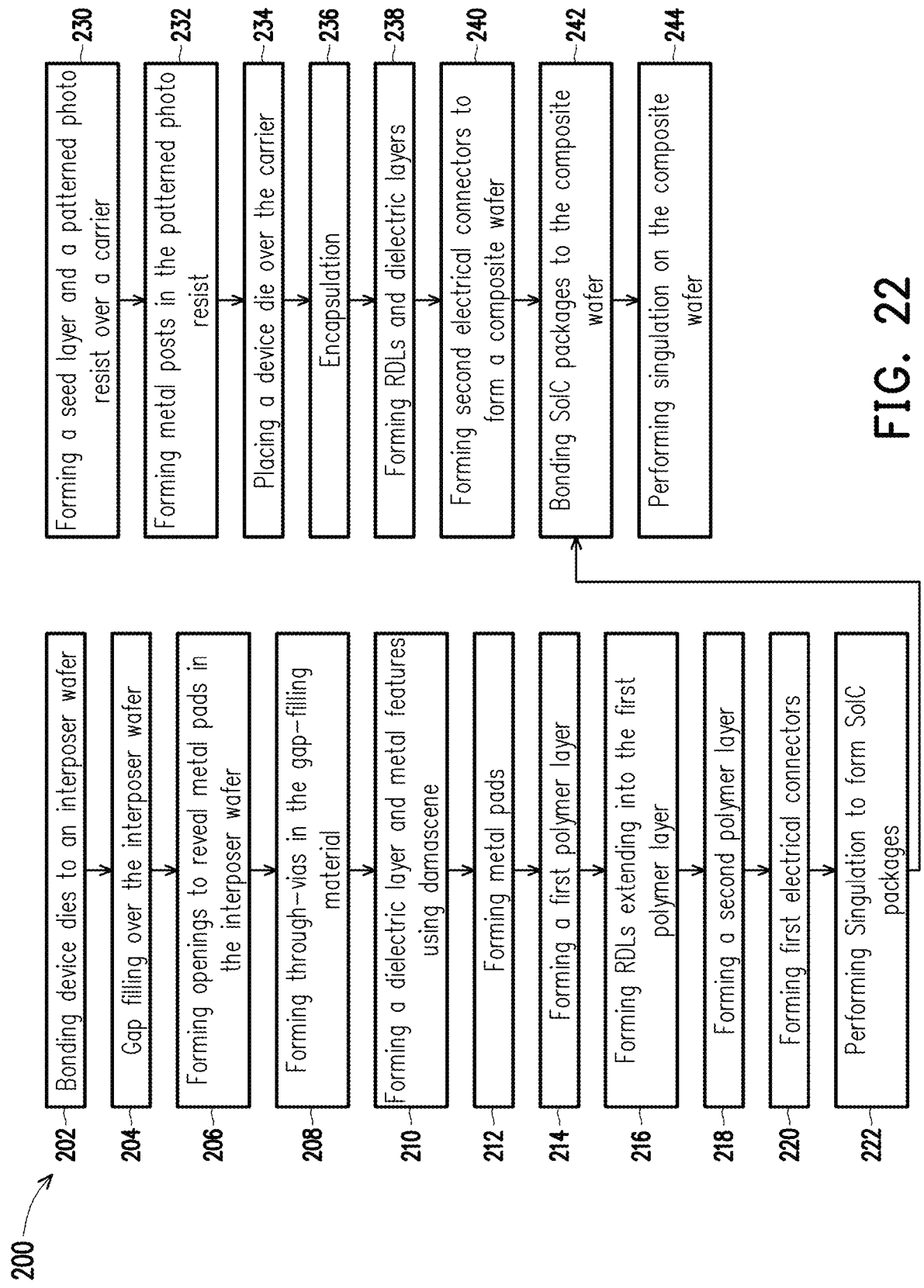
FIG. 22 illustrates a process flow for forming an integrated package including a SoIC package bonded to an InFO package in accordance with some embodiments.

Next, device dies 42A and 42B are bonded to wafer 2, as shown in FIG. 2. The respective process is illustrated as process 202 in the process flow shown in FIG. 22. In accordance with some embodiments of the present disclosure, device dies 42A and 42B are memory dies such as Dynamic Random Access Memory (DRAM) dies or Static Random Access Memory (SRAM) dies. Each of device dies 42A and 42B may also be a Central Processing Unit (CPU) die, a Micro Control Unit (MCU) die, an input-output (IO) die, a BaseBand (BB) die, or an Application processor (AP) die. Device dies 42A and 42B may be the same type or different types of dies selected from the above-listed types. Furthermore, device dies 42A and 42B may be formed using different technologies such as 45 nm technology, 28 nm technology, 20 nm technology, or the like. Dies 4, device die 42A and device dies 42B in combination function as a package, which may be a memory package or logic package.

Device dies 42A and 42B include substrates 44A and 44B, respectively, which may be semiconductor substrates such as silicon substrates. In accordance with some embodiments, the substrates 44A and 44B are also referred to as semiconductor substrates 44A and 44B. In accordance with some embodiments of the present disclosure, device dies 42A and 42B are free from Through-Silicon Vias (TSVs) therein. Also, device dies 42A and 42B include interconnect structures 48A and 48B, respectively, for connecting to the active devices and passive devices in device dies 42A and 42B. Interconnect structures 48A and 48B include metal lines and vias, which are illustrated schematically. Substrates 44A and 44B are free from through-vias therein. Accordingly, all external electrical connections of device dies 42A and 42B are made through bond pads 50A and 50B.

Device die 42A includes bond pads 50A and dielectric layer 52A at the illustrated bottom surface. The bottom surfaces of bond pads 50A are coplanar with the bottom surface of dielectric layer 52A. Device die 42B includes bond pads 50B and dielectric layer 52B at the illustrated bottom surface. The bottom surfaces of bond pads 50B are coplanar with the bottom surface of dielectric layer 52B. In accordance with some embodiments of the present disclosure, device dies 42A and 42B are free from organic dielectric materials such as polymer, resin, molding compound, and the like.

The bonding of device dies 42A and 42B to wafer 2 may be achieved through hybrid bonding. For example, bond pads 50A and 50B are bonded to bond pads 36A through metal-to-metal direct bonding. In accordance with some embodiments of the present disclosure, the metal-to-metal direct bonding is copper-to-copper direct bonding. Furthermore, dielectric layers 52A and 52B are bonded to surface dielectric layer 34, for example, with fusion bonds (which may include Si—O—Si bonds) generated.

To achieve the hybrid bonding, device dies 42A and 42B are first pre-bonded to surface dielectric layer 34 and bond pads 36A by lightly pressing device dies 42A and 42B against interposer die 4. Although two device dies 42A and 42B are illustrated, the hybrid bonding may be performed at wafer level, and a plurality of device die groups identical to the illustrated die group including device dies 42A and 42B is pre-bonded, and arranged as rows and columns.

After all device dies 42A and 42B are pre-bonded, an anneal is performed to cause the inter-diffusion of the metals in bond pads 36A and the corresponding overlying bond pads 50A and 50B. The annealing temperature may be in the range between about 200° and about 400° C., and may be in the range between about 300° and about 400° C. in accordance with some embodiments. The annealing time is in the range between about 1.5 hours and about 3.0 hours, and may be in the range between about 1.5 hours and about 2.5 hours in accordance with some embodiments. Through the hybrid bonding, bond pads 50A and 50B are bonded to the corresponding bond pads 36A through direct metal bonding caused by metal inter-diffusion.

Surface dielectric layer 34 is also bonded to dielectric layers 52A and 52B, with bonds formed therebetween. For example, the atoms (such as oxygen atoms) in one of surface dielectric layer 34 and dielectric layers 52A/52B form chemical or covalence bonds with the atoms (such as silicon atoms) in the other one of surface dielectric layers 34 and dielectric layer 52A/52B. The resulting bonds between surface dielectric layers 34 and dielectric layer 52A/52B are dielectric-to-dielectric bonds. Bond pads 50A and 50B may have sizes greater than, equal to, or smaller than, the sizes of the respective bond pads 36A. Gaps 46 are left between neighboring device dies 42A and 42B.

Further referring to FIG. 2, a backside grinding may be performed to thin device dies 42A and 42B, for example, to a thickness between about 15 μm and about m. FIG. 2 schematically illustrates dashed lines 44A-BS1 and 44B-BS1, which are the back surfaces of device dies 42A and 42B, respectively before the backside grinding. 44A-BS2 and 44B-BS2 are the back surfaces of device dies 42A and 42B, respectively after the backside grinding. Through the thinning of device dies 42A and 42B, the aspect ratio of gaps 46 between neighboring device dies 42A and 42B is reduced. Otherwise, the gap-filling may be difficult due to the otherwise high aspect ratio of gaps 46. In accordance with other embodiments in which the aspect ratio of gaps 46 is not too high for gap filling, the backside grinding is skipped.

Figure 3:
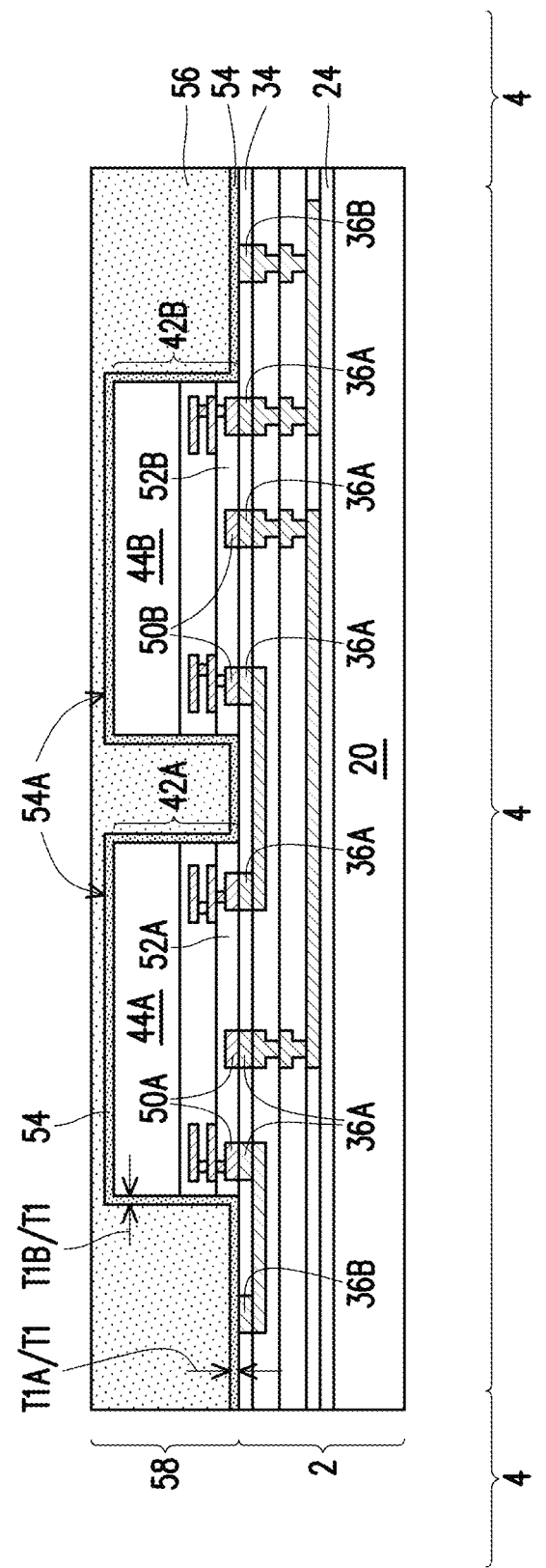

FIG. 3 illustrates the formation of gap-filling layers/regions 54 and 56. The respective process is illustrated as process 204 in the process flow shown in FIG. 22. In accordance with some embodiments of the present disclosure, the gap-filling layers includes dielectric layer 54, and dielectric layer 56 over and contacting etch stop layer 54. Dielectric layer 54 may be deposited using a conformal deposition method such as Atomic Layer Deposition (ALD) or Chemical Vapor Deposition (CVD). In accordance with some embodiments, dielectric layer 54 is also referred as to an etch stop layer or a dielectric liner. Dielectric layer 56 may be formed using a conformal deposition method, or a non-conformal deposition method such as High-Density Plasma Chemical Vapor Deposition (HDPCVD), Flowable Chemical Vapor Deposition (CVD), spin-on coating, or the like. In accordance with some embodiments of the present disclosure, the gap-filling layers are free from organic materials such as polymers, resin, molding compounds, and the like.

Etch stop layer 54 is formed of a dielectric material that has a good adhesion to the top surfaces and sidewalls of device dies 42A and 42B and the top surfaces of surface dielectric layer 34 and bond pads 36B. Etch stop layer 54 also extends on the top surfaces of device dies 42A and 42B. In accordance with some embodiments of the present disclosure, etch stop layer 54 is formed of a nitride-containing material such as silicon nitride. The thickness T1 (including T1A and T1B) of etch stop layer 54 may be in the range between about 500 Å and about 1,000 Å. It is appreciated that the values recited throughout the description are examples, and different values may be used. Etch stop layer 54 may be a conformal layer, for example, with the thickness T1A of horizontal portions and thickness T1B of the vertical portions being substantially equal to each other, for example, with the difference (T1A−T1B) having an absolute value smaller than about 20 percent, or smaller than about 10 percent, of both thicknesses T1A and T1B.

Dielectric layer 56 is formed of a material different from the material of etch stop layer 54. Dielectric layer 56 may be formed of an inorganic dielectric material. In accordance with some embodiments of the present disclosure, dielectric layer 56 includes an oxide such as silicon oxide, which may be formed of TEOS, while other dielectric materials such as silicon carbide, silicon oxynitride, silicon oxy-carbo-nitride, or the like may also be used when there is an adequate etching selectivity (for example, higher than about 50) between dielectric layer 56 and etch stop layer 54. The etching selectivity is the ratio of the etching rate of dielectric layer 56 to the etching rate of etch stop layer 54 when etching dielectric layer 56 in a subsequent process. Dielectric layer 56 fully fills gaps 46 (FIG. 2), and further includes some portions overlapping device dies 42A and 42B. Dielectric layer 56 may be formed of a non-conformal formation method or a conformal formation method.

A planarization process such as a CMP process or a mechanical grinding process is performed to remove the excess portions of dielectric layer 56. In accordance with some embodiments of the present disclosure, the planarization is stopped when there is a layer of dielectric layer 56 overlapping device dies 42A and 42B. Accordingly, etch stop layer 54 is not polished. In accordance with alternative embodiments of the present disclosure, the planarization is performed using etch stop layer 54 as a CMP stop layer. As a result, when the planarization is stopped, the top surfaces 54A of etch stop layer 54 are exposed, and there are remaining horizontal portions of etch stop layer 54 overlapping device dies 42A and 42B. In accordance with yet other embodiments of the present disclosure, the planarization is stopped after substrates 44A of device die 42A and substrate 44B of device die 42B are exposed. The remaining portions of etch stop layers 54 and dielectric layer 56 are collectively referred to as (gap-filling) isolation regions 58. Isolation regions 58 are also referred to as inorganic gap-filling (or gap-fill) regions.

Figure 4:
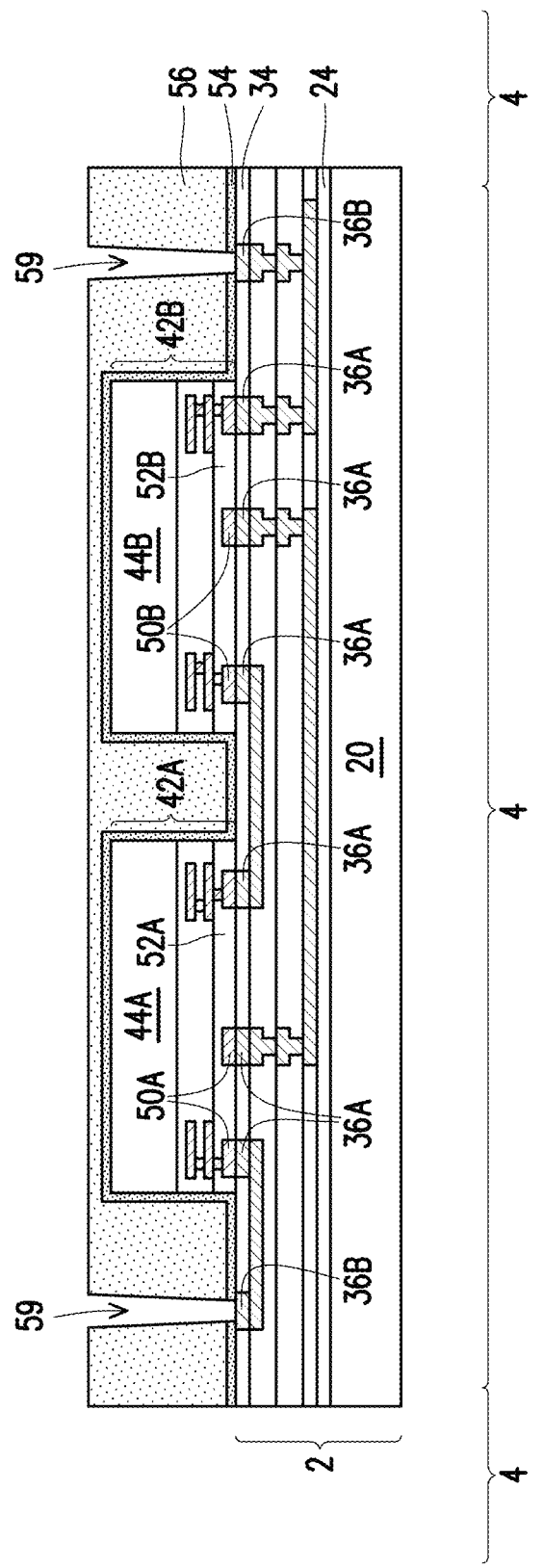

FIG. 4 illustrates the etching of dielectric layer 56 to form openings 59. The respective process is illustrated as process 206 in the process flow shown in FIG. 22. In accordance with some embodiments of the present disclosure, a photo resist (not shown) is formed and patterned, and dielectric layer 56 is etched using the patterned photo resist as an etching mask. Openings 59 are thus formed, and extend down to etch stop layer 54. In accordance with some embodiments of the present disclosure, dielectric layer 56 comprises an oxide, and the etching may be performed through dry etching. The etching gas may include a mixture of $NF_3$ and $NH_3$, or a mixture of HF and $NH_3$. Using etch top layer 54 to stop the etching for forming openings 59 allows the downward proceeding of multiple openings 59 on the same wafer 2 to be synchronized at the same intermediate level, so that the faster-etched openings 59 will wait for the slower-etched openings 59 before they extend downwardly again.

Next, etch stop layer 54 is etched, so that openings 59 extend down to bond pads 36B. In accordance with some embodiments of the present disclosure, etch stop layer 54 comprises silicon nitride, and the etching is performed using dry etching. The etching gas may include a mixture of $CF_4$, $O_2$, and $N_2$, a mixture of $NF_3$ and $O_2$, $SF_6$, or a mixture of $SF_6$ and $O_2$.

Figure 5:
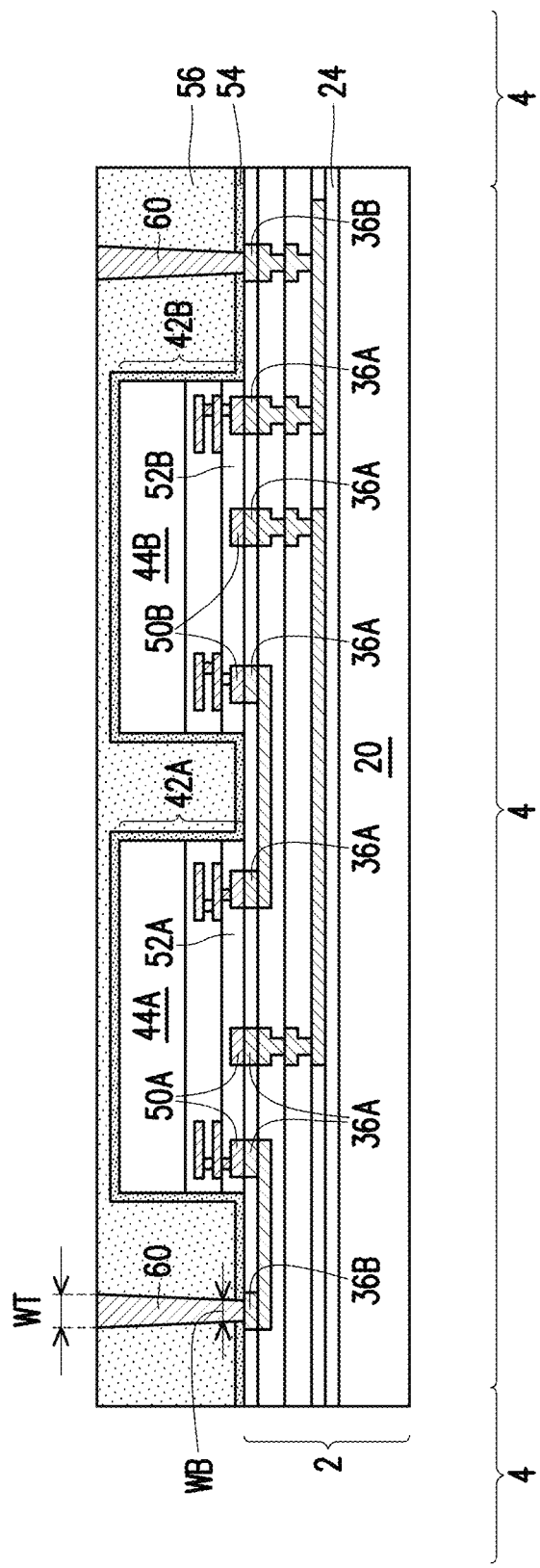

FIG. 5 illustrates the formation of through-vias 60, which fills openings 59 (FIG. 4), and are connected to bond pads 36B. The respective process is illustrated as process 208 in the process flow shown in FIG. 22. In accordance with some embodiments of the present disclosure, the formation of through-vias 60 includes performing a plating process such as an electrical-chemical plating process or an electro-less plating process. Through-vias 60 may include a metallic material such as tungsten, aluminum, copper, or the like. A conductive barrier layer (such as titanium, titanium nitride, tantalum, tantalum nitride, or the like) may also be formed underlying the metallic material. A planarization process such as a CMP process is performed to remove excess portions of the plated metallic material, and the remaining portions of the metallic material form through-vias 60. Through-vias 60 may have substantially straight and vertical side walls. Also, through-vias 60 may have a tapered profile, with top widths WT slightly greater than the respective bottom widths WB. In accordance with some embodiments, as shown in FIG. 5, a single through-via 60 is formed to contact each of bond pads 36B. In accordance with alternative embodiments, a plurality of through-via 60 (such as two or three) are formed over and contacting a same bond pad 36B.

Figure 6:
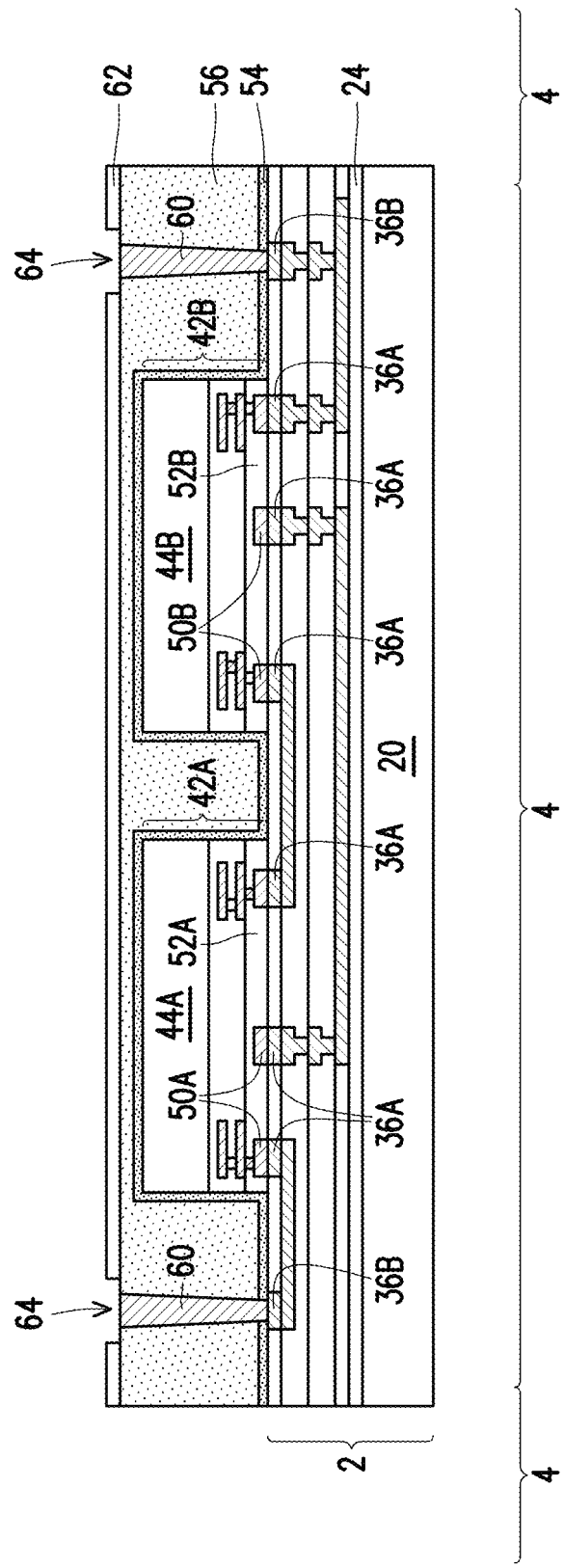

Referring to FIG. 6, dielectric layer 62, which may be an inorganic layer, is formed. The respective process is illustrated as process 210 in the process flow shown in FIG. 22. In accordance with some embodiments of the present disclosure, dielectric layer 62 is formed of a low-k dielectric material having a k value lower than 3.8, and the k value may be lower than about 3.0, and lower than about 2.5, for example. In accordance with alternative embodiments, dielectric layer 62 is formed of an oxide such as silicon oxide, a nitride such as silicon nitride, or the like. Dielectric layer 62 is then patterned in a lithography process to form openings 64, and through-vias 60 are exposed.

Figure 7:
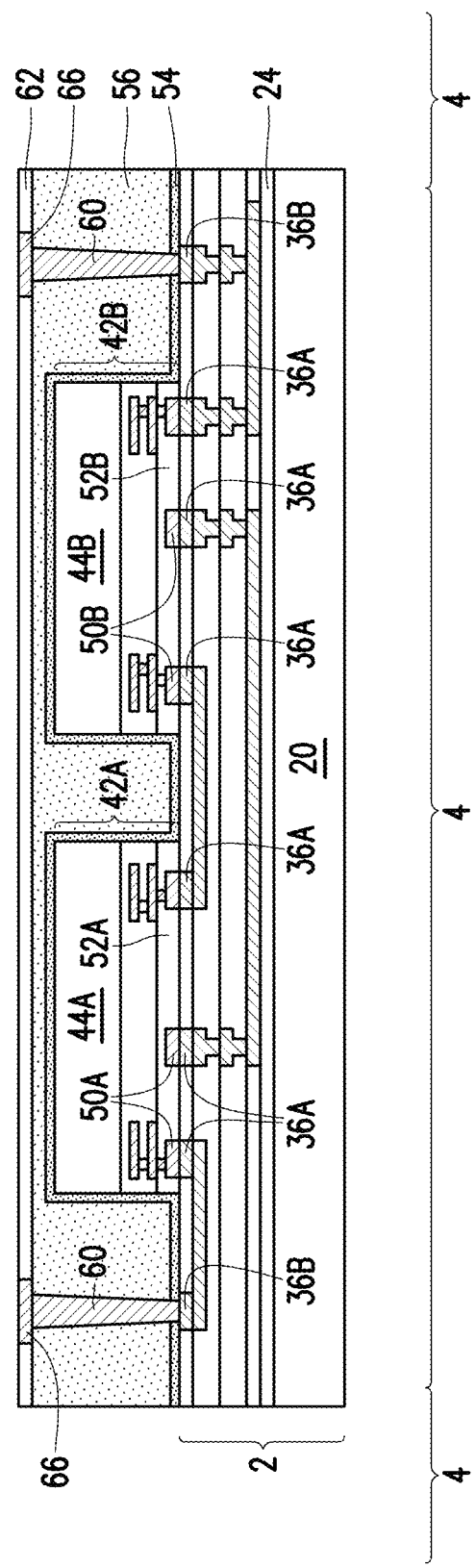

Metal features 66 are then formed, as shown in FIG. 7. The respective process is also illustrated as process 210 in the process flow shown in FIG. 22. Metal features 66 may include metal lines and metal pads, and may be formed using a damascene process, which includes depositing a conformal conductive barrier layer into openings 64 (FIG. 6), plating a metallic material such as copper or a copper alloy, and performing a planarization to remove excess portions of metal features 66. Metal features 66 may have a single damascene structure as illustrated in FIG. 7. In accordance with other embodiments of the present disclosure, metal features 66 have a dual damascene structure.

In accordance with some embodiments of the present disclosure, the combined structure including dielectric layer 62 and all underlying structures are free from organic materials (such as polymer layers, molding compound, resin, or the like), so that the process for forming metal features 66 may adopt the process used for forming device dies, and fine-pitches metal lines 66 having small pitches and line-widths are made possible.

Figure 8:
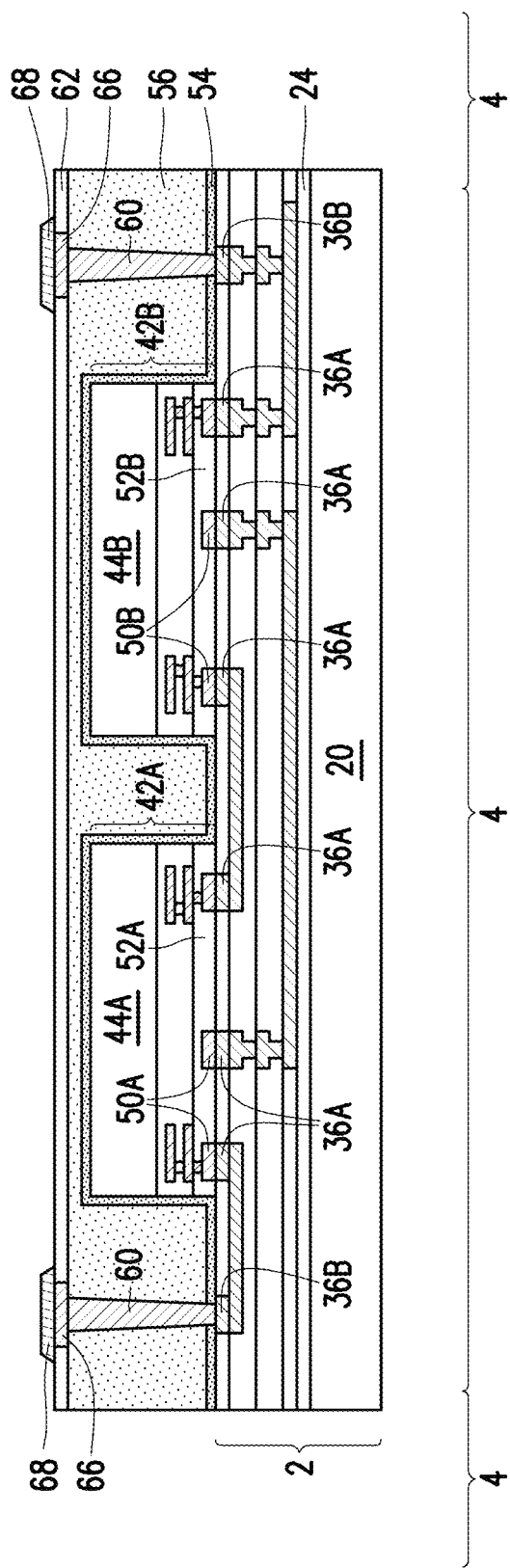

FIG. 8 illustrates the formation of metal pads 68. The respective process is illustrated as process 212 in the process flow shown in FIG. 22. In accordance with some embodiments, metal pads 68 are formed of aluminum copper. The formation may include depositing a metal layer, and patterning the metal layer. The remaining portions of the etched metal layer are metal pads 68.

Figure 9:
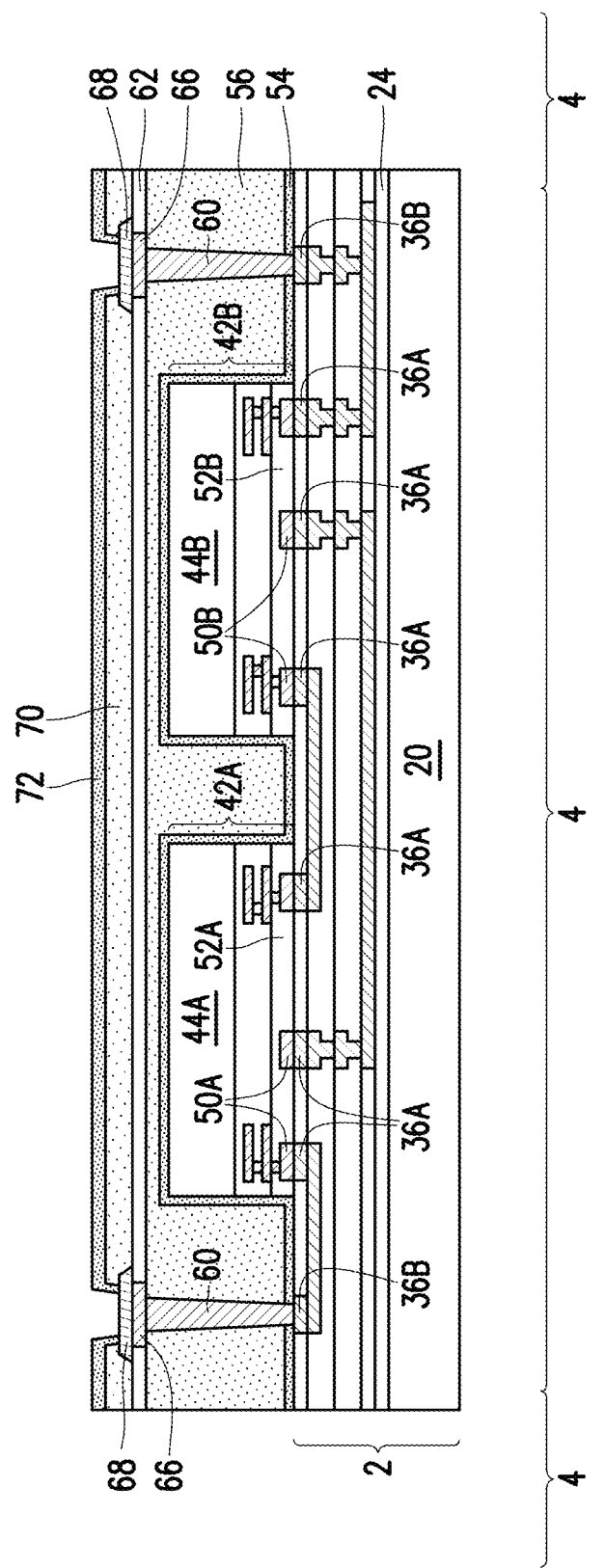

FIG. 9 illustrates the formation of passivation layer 70 and polymer layer 72. Passivation layer 70 is formed over and contacting dielectric layer 62 in accordance with some embodiments. Passivation layer 70 may be a single layer or a composite layer, and may be formed of a non-porous material. In accordance with some embodiments of the present disclosure, passivation layer 70 is a composite layer including a silicon oxide layer (not shown separately), and a silicon nitride layer (not shown separately) over the silicon oxide layer. Passivation layer 70 may also be formed of other non-porous dielectric materials such as Un-doped Silicate Glass (USG), silicon oxynitride, and/or the like.

Next, passivation layer 70 is patterned, so that some portions of metal pads 68 are exposed through openings in passivation layer 70. Polymer layer 72 is then formed. The respective process is illustrated as process 214 in the process flow shown in FIG. 22. Polymer layer 72 may be formed of polyimide, polybenzoxazole (PBO), or the like. Polymer layer 72 is also patterned to form openings, through which metal pads 68 are exposed. In accordance with some embodiments, polymer layer 72 has a great thickness, which may be in the range between about 3 µm and about 6 µm.

Figure 10:
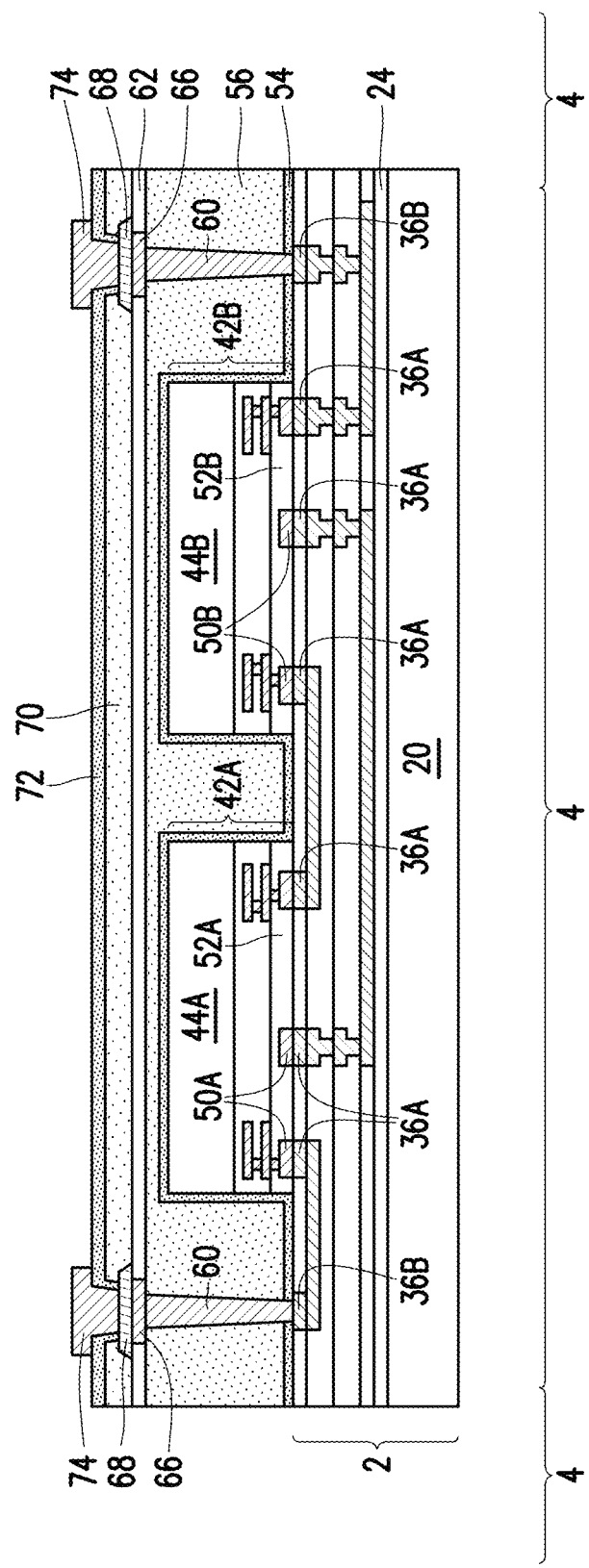

Referring to FIG. 10, Redistribution Lines (RDLs) 74 are formed, and the via-portions of RDLs 74 extend into the openings in polymer layer 72 (FIG. 9) to electrically connect to metal pads 68. The respective process is illustrated as process 216 in the process flow shown in FIG. 22. It is appreciated that RDLs 74 may include metal pads and metal lines, and may be used for routing, so that the metal pads in RDLs 74 may be rerouted into the regions overlapping device dies 42A and 42B.

Figure 11:
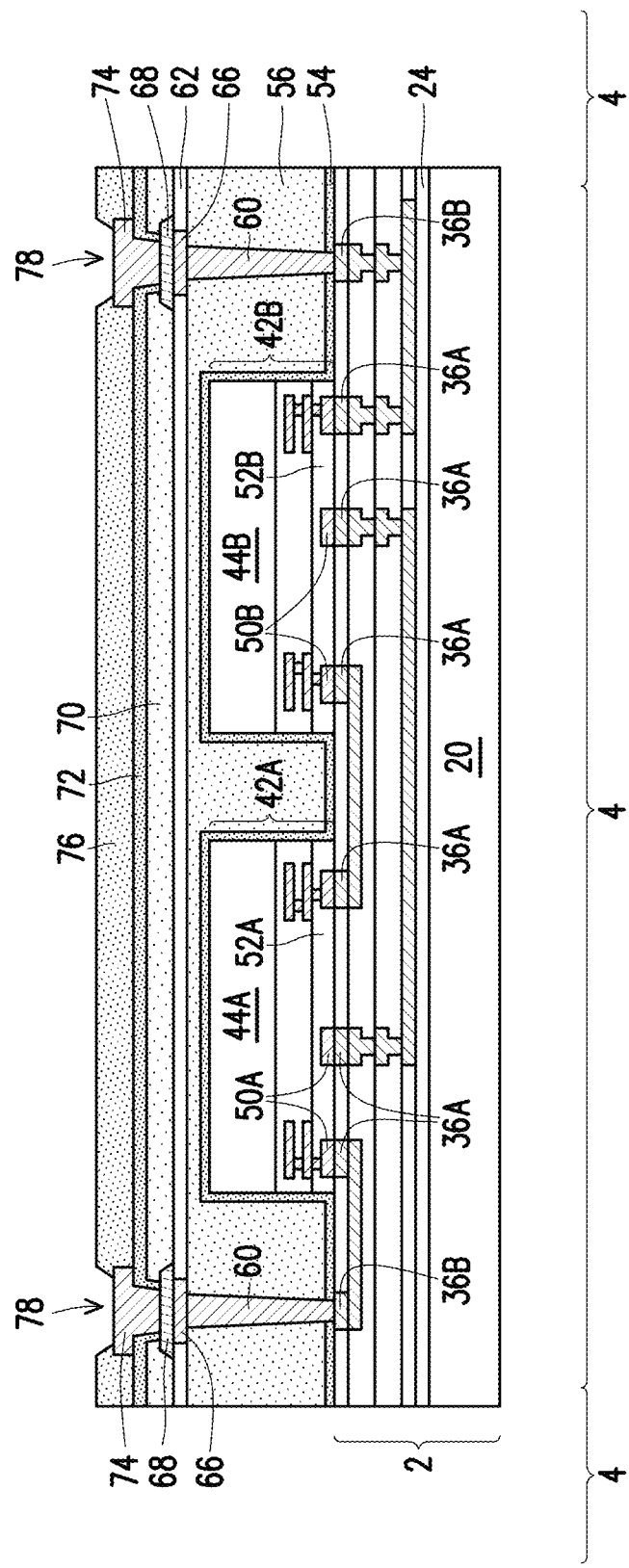

FIG. 11 illustrates the formation of polymer layer 76, which may be formed of polyimide, PBO, or the like. The respective process is illustrated as process 218 in the process flow shown in FIG. 22. Openings 78 are formed in polymer layer 76 to reveal RDLs 74. In accordance with some embodiments, polymer layer 76 has a great thickness, which may be in the range between about 5 µm and about 10 µm. Since polymer layers 72 and 76 have low Young's moduli, which are much lower than the Young's moduli in underlying layers formed of inorganic material, polymer layers 72 and 76 can absorb the stress in the resulting package. With polymer layers 72 and 76 having great thicknesses, their ability for absorbing stress is improved. For example, the structure underlying polymer layers 72 and 76, which underlying structure includes wafer 2, device dies 42A and 42B, and dielectric regions 56, may or may not include polymer. When the underlying layers do not include polymers, the package may benefit from polymer layers 72 and 76 for their ability for absorbing stress.

Referring to 12, Under-bump metallurgies (UBMs) 80 are formed, and UBMs 80 extend into polymer layer 76 to connect to RDLs 74. In accordance with some embodiments of the present disclosure, each of UBMs 80 includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in UBMs 80. In accordance with some embodiments, the formation of UBMs 80 include depositing a blanket barrier layer and a blanket seed layer, forming a patterned etching mask (such as a patterned photo resist) over the seed layer, and then etching the blanket seed layer and the blanket barrier layer. In accordance with other embodiments, the formation of UBMs 80 include depositing a blanket barrier layer and a blanket seed layer, forming a patterned plating mask (such as a patterned photo resist) over the blanket seed layer, plating metal pillars in the openings in the patterned plating mask, removing the patterned plating mask, and then etching the portions of the blanket seed layer and the blanket barrier layer previously covered by the patterned plating mask.

As also shown in FIG. 12, electrical connectors 82 are formed over and contacting UBMs 80. The respective process is illustrated as process 220 in the process flow shown in FIG. 22. Electrical connectors 82 may include metal pillars, solder regions, or the like. Throughout the description, the structure shown in FIG. 12 is referred to as composite wafer 84. A die-saw (singulation) step is performed on composite wafer 84 to separate composite wafer 84 into a plurality of SoIC packages 86. The respective process is illustrated as process 222 in the process flow shown in FIG. 22.

Figure 13:
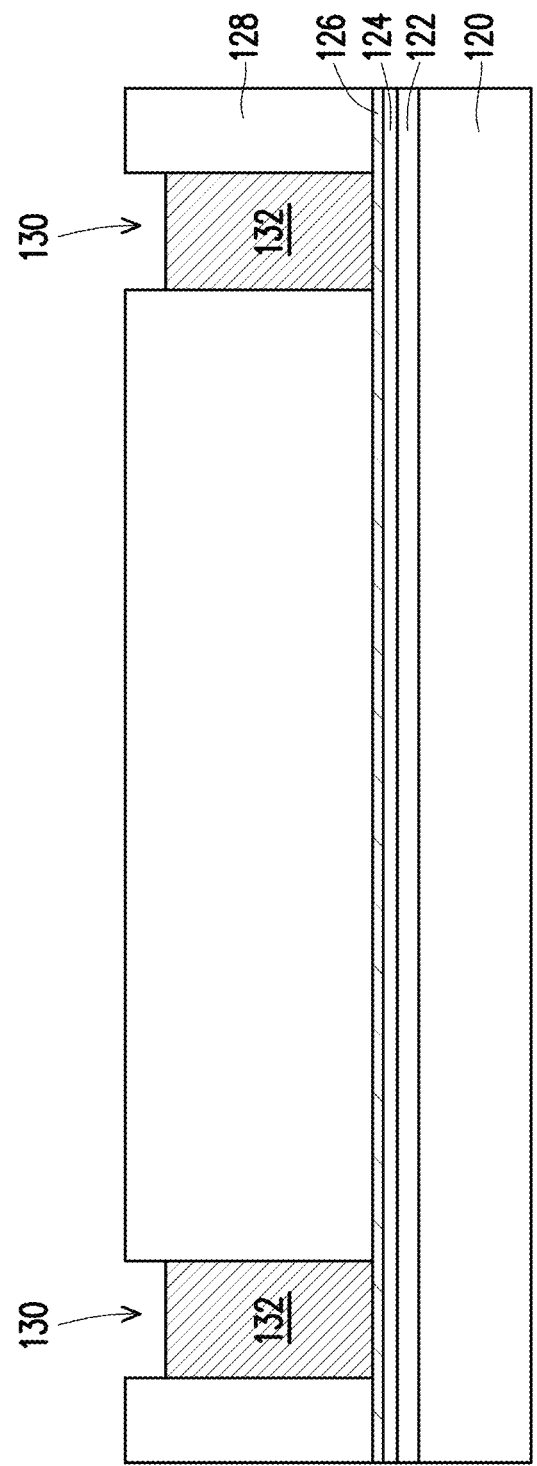
FIGS. 13 through 18 are cross-sectional views of intermediate stages in the formation of an Integrated Fan-Out (InFO) package in accordance with some embodiments.

FIGS. 13 through 18 illustrate the cross-sectional views of intermediate stages in the formation of an Integrated Fan-Out (InFO) package in accordance with some embodiments. Referring to FIG. 13, carrier 120 is provided, and release film 122 is formed on carrier 120. Carrier 120 is formed of a transparent material, and may be a glass carrier, a ceramic carrier, an organic carrier, or the like. Release film 122 may be formed of a Light-To-Heat-Conversion (LTHC) coating material, which is applied onto carrier 120 through coating. In accordance with some embodiments, the release film 122 is also referred to as a LTHC coating material. In accordance with some embodiments of the present disclosure, the LTHC coating material is capable of being decomposed under the heat of light/radiation (such as laser), and hence can release carrier 120 from the structure formed thereon.

In accordance with some embodiments, as also shown in FIG. 1, polymer buffer layer 124 is formed on LTHC coating material 122. In accordance with some embodiments, polymer buffer layer 124 is formed of PBO, polyimide, benzocyclobutene (BCB), or another applicable polymer.

Metal seed layer 126 is formed, for example, through Physical Vapor Deposition (PVD). The respective process is illustrated as process 230 in the process flow shown in FIG. 22. Metal seed layer 126 may be in physical contact with polymer buffer layer 124. In accordance with some embodiments of the present disclosure, metal seed layer 126 includes a titanium layer and a copper layer over the titanium layer. In accordance with alternative embodiments of the present disclosure, metal seed layer 126 includes a copper layer contacting LTHC coating material 122.

Photo resist 128 is formed over metal seed layer 126. The respective process is also illustrated as process 230 in the process flow shown in FIG. 22. A light-exposure is then performed on photo resist 128 using a photo lithography mask (not shown). After a subsequent development, openings 130 are formed in photo resist 128. Some portions of metal seed layer 126 are exposed through openings 130. Next, metal posts 132 are formed by plating a metallic material in openings 130. The plated metallic material may be copper or a copper alloy. The respective process is illustrated as process 232 in the process flow shown in FIG. 22.

Figure 14:
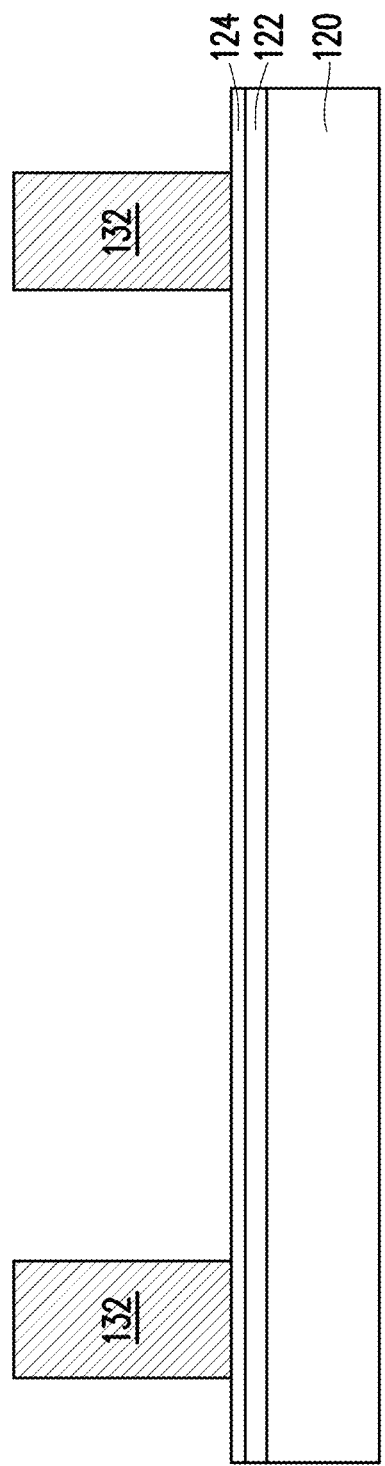

In subsequent steps, photo resist 128 is removed, and hence the underlying portions of metal seed layer 126 are exposed. The exposed portions of metal seed layer 126 are then removed in an etching step, for example, in an anisotropic or an isotropic etching step. The edges of the remaining metal seed layer 126 are thus co-terminus with the respective overlying portions of metal posts 132. The resulting metal posts 132 are illustrated in FIG. 14. Throughout the description, the remaining portions of metal seed layer 126 are considered as parts of metal posts 132, and may not be illustrated separately. The top-view shapes of metal posts 132 include, and are not limited to, circular shapes, rectangles, hexagons, octagons, and the like.

Figure 15:
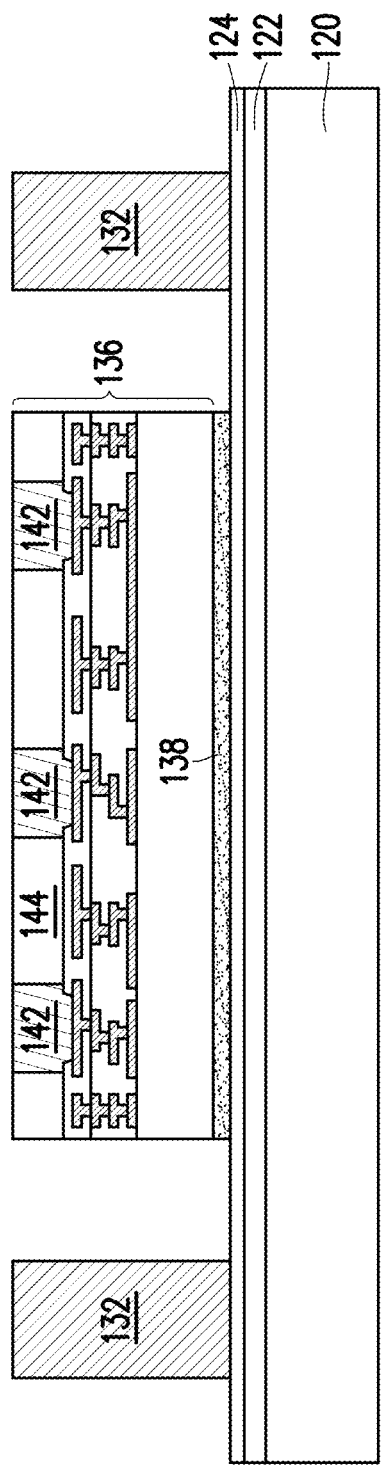

FIG. 15 illustrates the placement/attachment of device die 136. The respective process is illustrated as process 234 in the process flow shown in FIG. 22. Device die 136 is attached to polymer buffer layer 124 through Die-Attach Film (DAF) 138, which is an adhesive film pre-attached on device die 136 before device die 136 is placed on polymer buffer layer 124. Accordingly, DAF 138 and device die 136, before attached to polymer buffer layer 124, are in combination an integrated piece. Device die 136 may include a semiconductor substrate having a back surface (the surface facing down) in physical contact with DAF 138. Device die 136 may include integrated circuit devices (such as active devices, which include transistors, for example, not shown) at the front surface (the surface facing up) of the semiconductor substrate. In accordance with some embodiments of the present disclosure, device die 136 is a logic die, which may be a Central Processing Unit (CPU) die, a Graphic Processing Unit (GPU) die, a mobile application die, a Micro Control Unit (MCU) die, an input-output (IO) die, a BaseBand (BB) die, an Application processor (AP) die, or the like. Since carrier 120 is at wafer level, although one device die 136 is illustrated, a plurality of device dies 136 is placed over polymer buffer layer 124, and may be allocated as an array including a plurality of rows and a plurality of columns.

In accordance with some exemplary embodiments, metal pillars 142 (such as copper pillars) are pre-formed as portions of device die 136, and metal pillars 142 are electrically coupled to the integrated circuit devices such as transistors (not shown) in device die 136. In accordance with some embodiments of the present disclosure, a dielectric material such as a polymer fills the gaps between neighboring metal pillars 142 to form top dielectric layer 144. Top dielectric layer 144 may also include a portion covering and protecting metal pillars 142. Top dielectric layer 144 may be a polymer layer, which may be formed of PBO or polyimide in accordance with some embodiments of the present disclosure.

Figure 16:
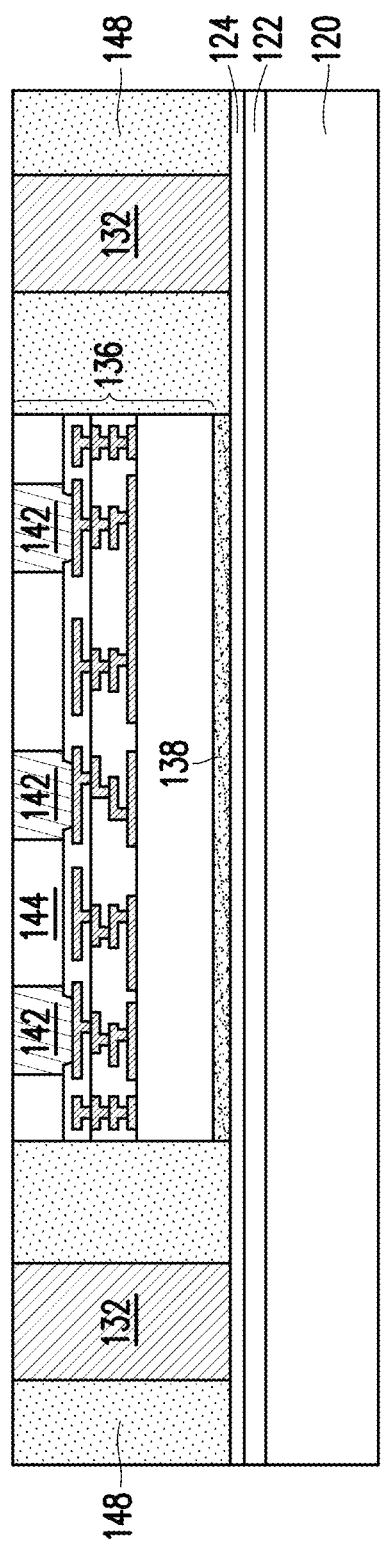

Next, device die 136 and metal posts 132 are encapsulated in encapsulating material 148, as shown in FIG. 16. The respective process is illustrated as process 236 in the process flow shown in FIG. 22. Encapsulating material 148 may include a molding compound, a molding underfill, an epoxy, and/or a resin. When formed of molding compound, encapsulating material 148 may include a base material, which may be a polymer, a resin, an epoxy, or the like, and filler particles (not shown) in the base material. The filler particles may be dielectric particles of $SiO_2$, $Al_2O_3$, silica, or the like, and may have spherical shapes. Also, the spherical filler particles may have a plurality of different diameters. Both the filler particles and the base material in the molding compound may be in physical contact with polymer buffer layer 124.

The top surface of encapsulating material 148, as disposed, is higher than the top ends of metal pillars 142 and metal posts 132. In a subsequent step, as shown in FIG. 16, a planarization process such as a CMP process or a mechanical grinding process is performed to thin encapsulating material 148 and top dielectric layer 144, until metal posts 132 and metal pillars 142 are exposed. Metal posts 132 are alternatively referred to as through-vias 132 since they penetrate through encapsulating material 148. Due to the planarization process, the top ends of through-vias 132 are substantially level (coplanar) with the top surfaces of metal pillars 142, and are substantially coplanar with the top surface of encapsulating material 148.

Figure 17:
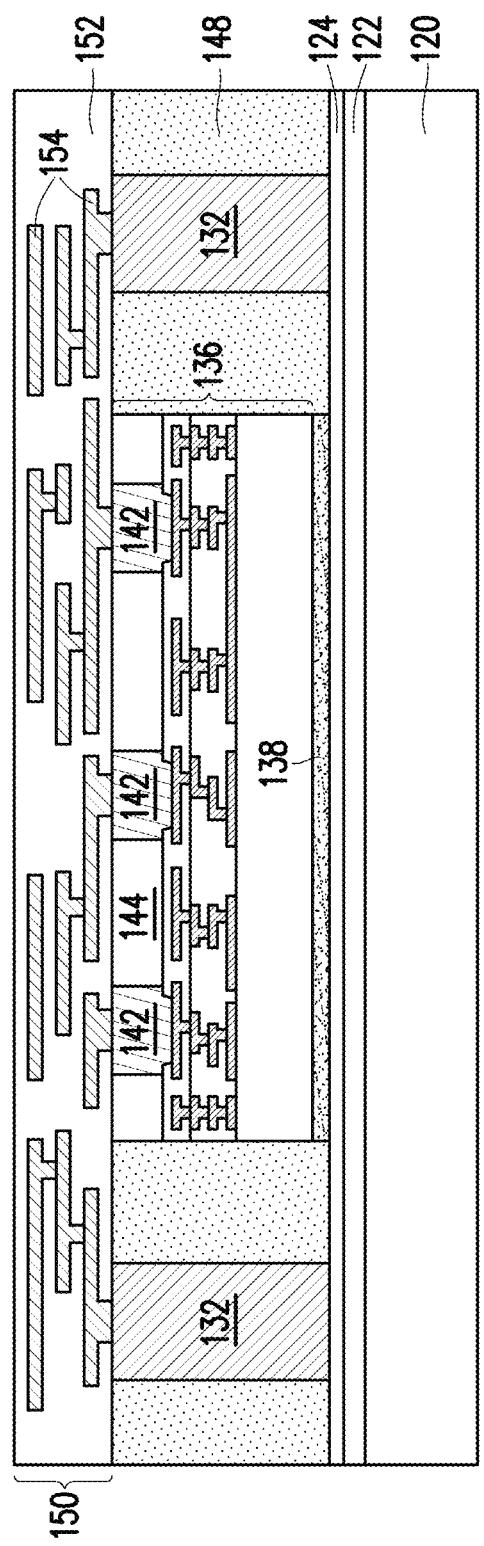

FIG. 17 illustrates the formation of a front-side redistribution structure 150, which includes dielectric layers 152 and RDLs 154 in dielectric layers 152. The respective process is illustrated as process 238 in the process flow shown in FIG. 22. In accordance with some embodiments of the present disclosure, dielectric layers 152 are formed of polymers such as PBO, polyimide, or the like. In accordance with alternative embodiments of the present disclosure, dielectric layers 152 are formed of inorganic dielectric materials such as silicon nitride, silicon oxide, or the like.

In accordance with some embodiments of the present disclosure, the formation of a dielectric layer 152 and the corresponding RDLs 154 may include depositing dielectric layer 152, forming via openings in the corresponding dielectric layer 152 to expose the underlying conductive features, depositing a metal seed layer (not shown), forming and patterning a photo resist (not shown) over the corresponding metal seed layer, and plating a metallic material such as copper and/or aluminum over the metal seed layer. The patterned photo resist is then removed, followed by etching the portions of the metal seed layer previously covered by the patterned photo resist.

Figure 18:
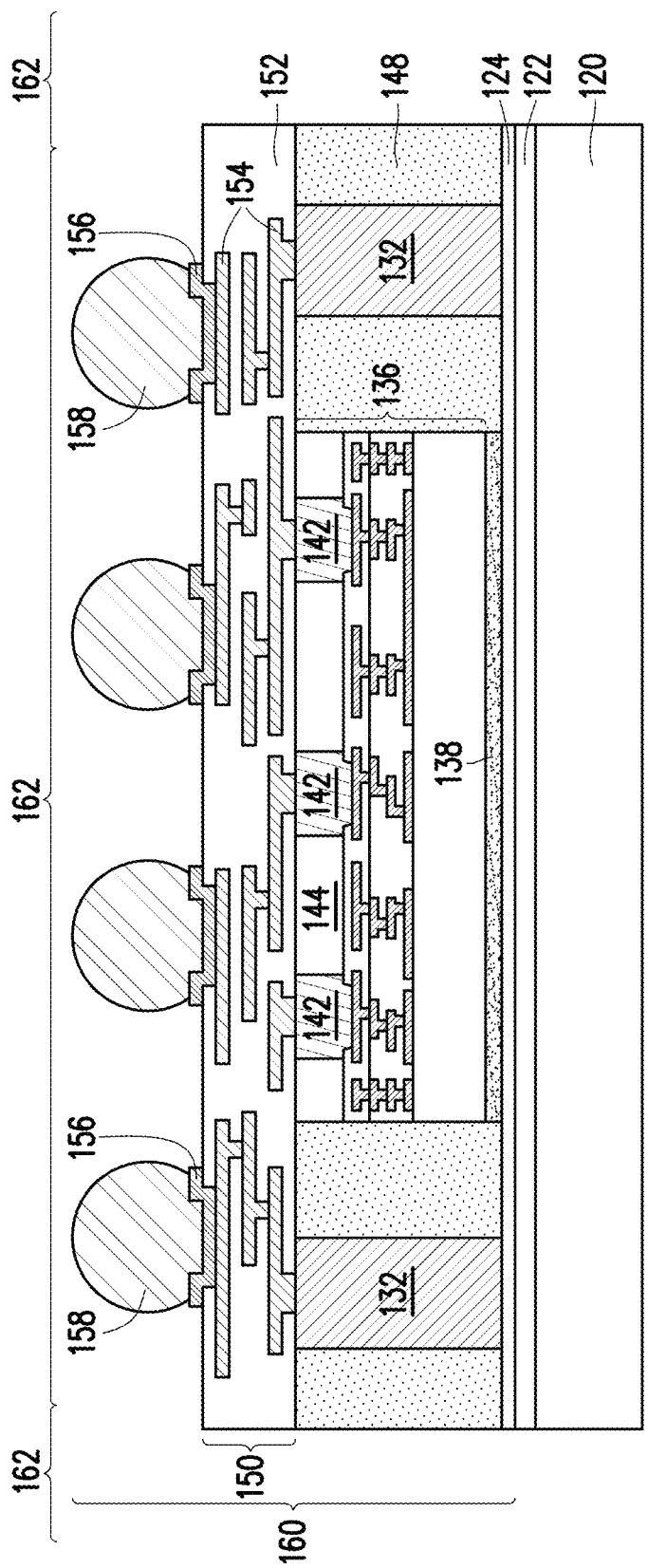

FIG. 18 illustrates the formation of UBMs 156. The top dielectric layer 152 is patterned to form openings, and UBMs 156 are formed to extend into the openings in the top dielectric layer 152 to contact the metal pads in RDLs 154. UBMs 156 may be formed of nickel, copper, titanium, or multi-layers thereof. In accordance with some exemplary embodiments, UBMs 156 include a titanium layer and a copper layer over the titanium layer.

Electrical connectors 158 are then formed. The respective process is illustrated as process 240 in the process flow shown in FIG. 22. The formation of electrical connectors 158 may include placing solder balls on the exposed portions of UBMs 156, and then reflowing the solder balls into solder regions. Throughout the description, the structure including polymer buffer layer 124 and the overlying structure in combination is referred to as package 160, which is a composite wafer (and also referred to as composite wafer 160 hereinafter) including a plurality of device dies 136. Next, composite wafer 160 is demounted from carrier 120, for example, by projecting a laser beam onto LTHC coating material 122, so that LTHC coating material 122 is decomposed, releasing composite wafer 160 from carrier 120. Composite wafer 160 includes a plurality of InFO packages 162 therein.

Figure 19:
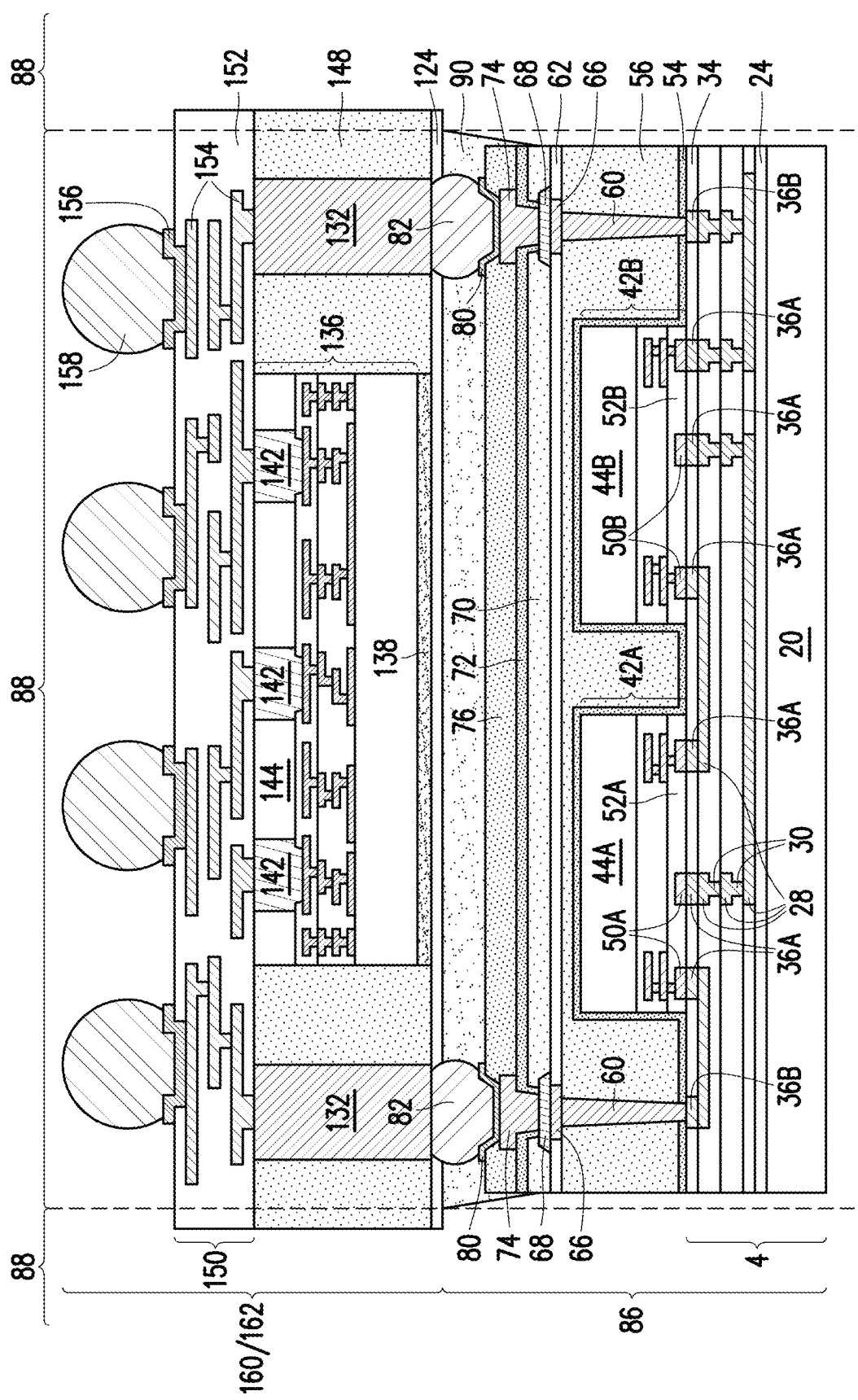
FIG. 19 illustrates a cross-sectional view of a package including a SoIC package bonded to an InFO package in accordance with some embodiments.

FIG. 19 illustrates the formation of package 88, which includes bonding SoIC package 86 to InFO package 162. The respective process is illustrated as process 242 in the process flow shown in FIG. 22. In accordance with some embodiments of the present disclosure, a plurality of SoIC packages 86 are bonded to composite wafer 160, with electrical connectors 82 of SoIC packages 86 penetrating through polymer buffer layer 124 of InFO package 162 to bond to through-vias 132. Underfill regions 90 are dispensed into the gaps between SoIC packages 86 and InFO packages 162. The resulting composite wafer 160 is then singulated, resulting in a plurality of packages 88. The respective process is illustrated as process 244 in the process flow shown in FIG. 22.

Figure 20:
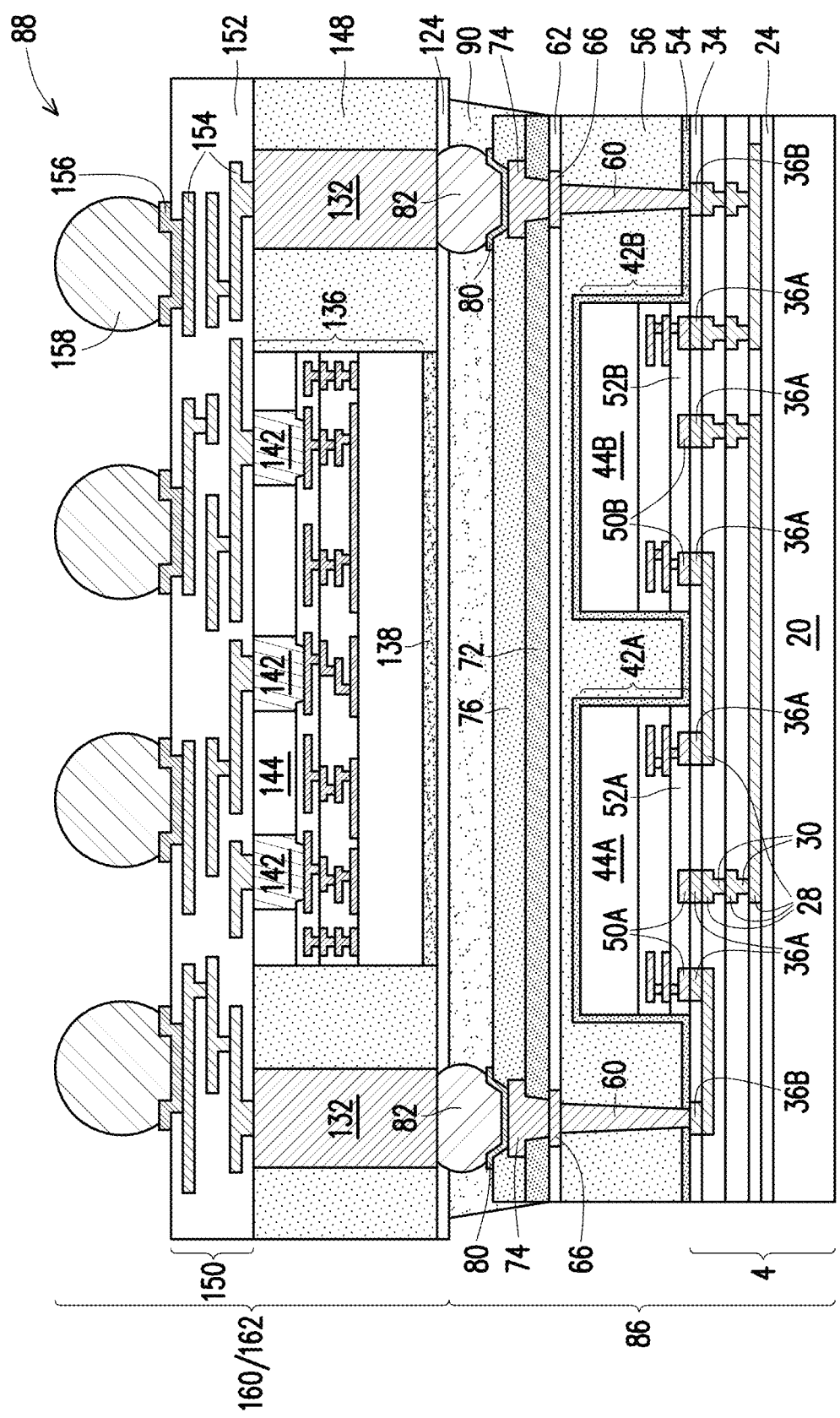
FIGS. 20 and 21 illustrate cross-sectional views of packages including SoIC packages bonded with InFO packages in accordance with some embodiments.
Figure 21:
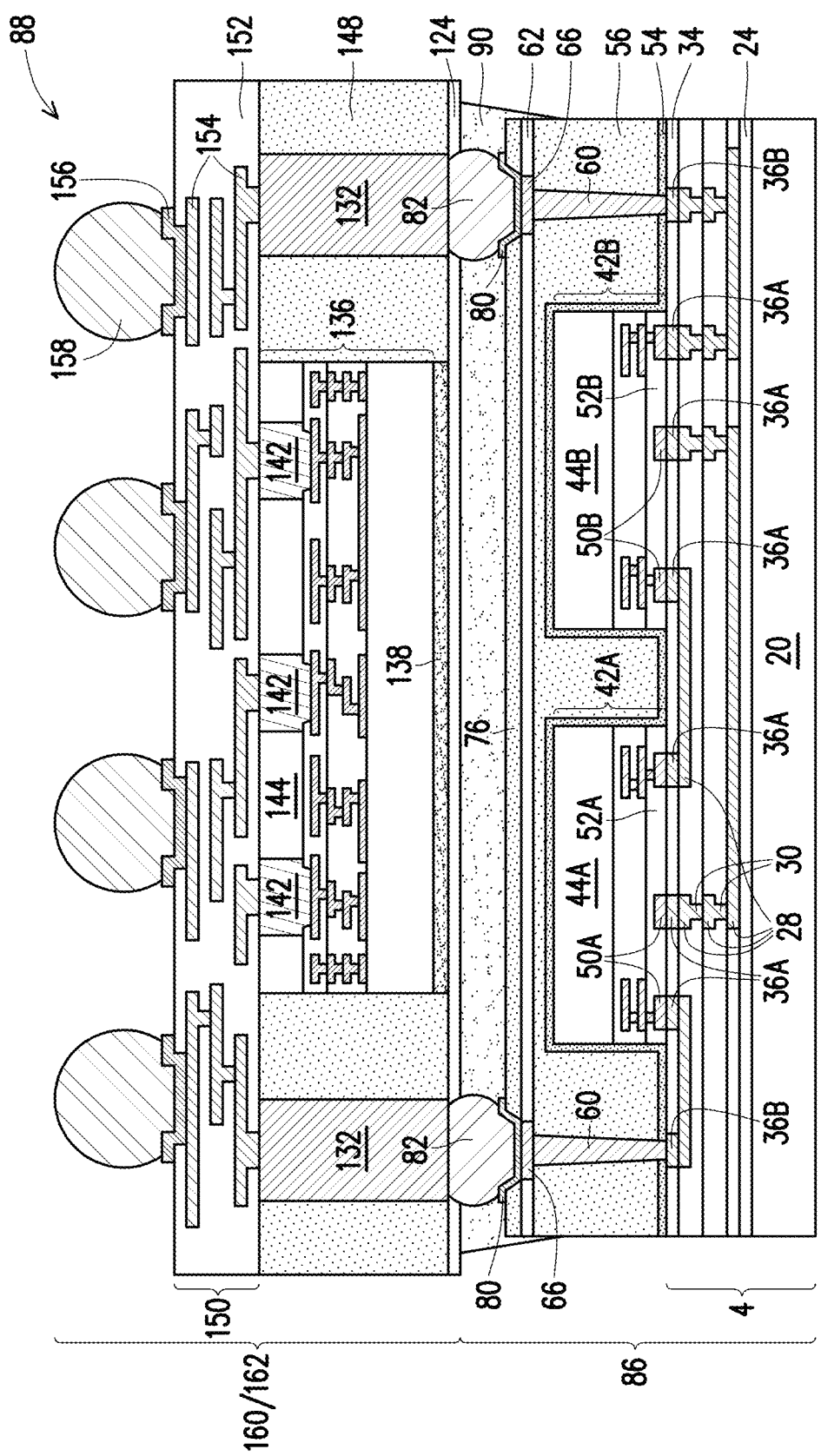

FIGS. 20 and 21 illustrate packages 88 in accordance with some embodiments of the present disclosure. The packages 88 in accordance with these embodiments are similar to package 88 as shown in FIG. 19, except some features in FIG. 19 are omitted. In accordance with some embodiments of the present disclosure, the metal pads 68 and passivation layer 70 as shown in FIG. 19 may be omitted. The resulting figure is illustrated in FIG. 20. In accordance with some other embodiments of the present disclosure, the metal pads 68, passivation layer 70, RDLs 74, and polymer layer 72 as shown in FIG. 19 are omitted. The resulting figure is illustrated in FIG. 21. In accordance with some embodiments of the present disclosure, when polymer layer 72 is omitted, the thickness of polymer layer 76 may (or may not) be increased, for example, to about 8 μm and about 16 μm, so that the polymer's ability for absorbing stress is maintained.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. Since the portions of SoIC package (such as what is shown in FIG. 8) are free from polymers, resins, and molding compounds, the CTE mismatch in this part of SoIC package is reduced, and the stress inside this part of the SoIC package is reduced. It is thus possible to form fine-pitch RDLs due to the reduction in the warpage. Some inorganic materials are hard and have high Young's moduli. The SoIC packages, if free from polymers, will have high hardness values. For example, silicon nitride, which is used in the SoIC package, has a Young's modulus greater than 100. Polymers such as polyimide and PBO, on the other hand, have Young's moduli equal to about 3.5 or lower. Accordingly, the added polymer layers may absorb the stress that cannot be absorbed by the hard inorganic materials in the SoIC packages. Experiment results indicate that if SoIC packages are free from polymers, after the SoIC packages are bonded to the composite wafer including the un-sawed InFO packages, the bonding may break, and the SoIC packages will fall off from the composite wafer. By forming polymer layers to absorb the stress, the bonding between the SoIC packages and the composite wafer is not damaged by the stress.

In accordance with some embodiments of the present disclosure, a method includes forming a first package comprising: bonding a first device die to an interposer wafer, wherein the interposer wafer comprises metal lines and vias; forming a gap-fill region to encircle the first device die; forming a through-via to penetrate through the gap-fill region, wherein the through-via is electrically connected to the first device die through the metal lines and the vias in the interposer wafer; forming a polymer layer over the gap-fill region; forming an electrical connector, wherein the electrical connector is electrically coupled to the through-via through a conductive feature in the polymer layer; and sawing the interposer wafer to separate the first package from other packages. In an embodiment, the forming the gap-fill region comprises forming a dielectric liner on surfaces of the interposer wafer and the first device die; filling a dielectric material on the dielectric liner; and planarizing the dielectric material. In an embodiment, after the planarizing, the dielectric liner comprises a portion overlapping the first device die. In an embodiment, the interposer wafer is free from active devices therein. In an embodiment, all dielectric materials underlying the polymer layer are inorganic materials. In an embodiment, the method further includes forming a second package comprising: forming a metal post; and encapsulating the metal post and a second device die in an encapsulating material; and bonding the second package to the first package. In an embodiment, the method further includes bonding a second device die to the interposer wafer, wherein the metal lines and vias electrically connect the first device die to the second device die, and the gap-fill region comprises a portion separating the first device die from the second device die. In an embodiment, the gap-filling region is formed of inorganic dielectric materials.

In accordance with some embodiments of the present disclosure, a method includes forming a first package comprising bonding a first device die and a second device die to an interposer die; encapsulating the first device die and the second device die in inorganic gap-fill materials; forming through-vias on metal pads of the interposer die, wherein the through-vias penetrate through the inorganic gap-fill materials, and are electrically connect to the first device die and the second device die through the interposer die; forming a dielectric layer over the first device die, the second device die, and the through-vias; forming metal features in the dielectric layer, wherein the metal features are formed using a damascene process; forming a polymer layer over the metal features, wherein all dielectric materials underlying the polymer layer are inorganic materials; and forming an electrical connector over the polymer layer; and bonding the first package to a second package, wherein the electrical connector is bonded to the second package. In an embodiment, the encapsulating the first device die and the second device die comprises depositing an etch stop layer contacting the first device die, the second device die, and the interposer die; forming a dielectric material over the etch stop layer; and planarizing the dielectric material. In an embodiment, the interposer die is free from active devices and passive devices, and all electrical connections from the first device die and the second device die to the second package are through the interposer die. In an embodiment, the forming the dielectric layer comprises forming a first low-k dielectric layer. In an embodiment, the polymer layer is in physical contact with the first low-k dielectric layer. In an embodiment, the interposer die comprises a second low-k dielectric layer, and the first low-k dielectric layer and the second low-k dielectric layer are on opposite sides of the inorganic gap-fill materials.

In accordance with some embodiments of the present disclosure, a device includes a first package comprising an interposer die free from active devices therein; a first device die and a second device die bonded to the interposer die; an inorganic gap-fill region encapsulating the first device die and the second device die therein; first through-vias penetrating through the inorganic gap-fill region, wherein the first through-vias are electrically connected to the first device die and the second device die through the interposer die; a dielectric layer over the first device die, the second device die, and the first through-vias; a polymer layer over the dielectric layer, wherein all dielectric materials underlying the polymer layer are inorganic materials; and an electrical connector over the polymer layer. In an embodiment, the device further includes a second package over and bonded to the first package, wherein the second package comprises: a third device die; a molding compound encapsulating the third device die therein; and second through-vias penetrating through the molding compound, wherein one of the second through-vias is bonded to the electrical connector. In an embodiment, the device further includes metal features in the dielectric layer, wherein the metal features have a damascene structure. In an embodiment, the dielectric layer is a low-k dielectric layer. In an embodiment, the inorganic gap-fill region comprises a silicon nitride layer lining surfaces of the interposer die, the first device die, and the second device die; and an oxide layer over the silicon nitride layer, wherein both the silicon nitride layer and the oxide layer comprise a portion overlapping the first device die. In an embodiment, the first device die and the second device die are electrically interconnected through conductive lines in the interposer die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first package comprising:
      bonding a first device die to an interposer wafer, wherein the interposer wafer comprises metal lines and vias;
      forming a dielectric region to encircle the first device die, wherein the forming the dielectric region comprises:
         forming a dielectric liner on a first top surface of the interposer wafer, wherein the dielectric liner further extends on sidewall surfaces and a second top surface of the first device die;
         filling a dielectric material on the dielectric liner; and
         planarizing the dielectric material;
      forming a through-via to penetrate through the dielectric region, wherein the through-via is electrically connected to the first device die through the metal lines and the vias in the interposer wafer;
      forming a polymer layer over the dielectric region;
      forming an electrical connector, wherein the electrical connector is electrically coupled to the through-via through a conductive feature in the polymer layer; and
      sawing the interposer wafer to separate the first package from other packages.
2. The method of claim 1, wherein the dielectric liner is formed using a conformal deposition method.
3. The method of claim 1, wherein after the planarizing, the dielectric liner comprises a portion overlapping the first device die.
4. The method of claim 1, wherein the interposer wafer is free from active devices therein.
5. The method of claim 1, wherein all dielectric materials underlying the polymer layer are inorganic materials.
6. The method of claim 1 further comprising:
   forming a second package comprising:
      forming a metal post; and
      encapsulating the metal post and a second device die in an encapsulating material; and
   bonding the second package to the first package.
7. The method of claim 1 further comprising forming a low-k dielectric layer over the dielectric region, wherein the polymer layer is over the low-k dielectric layer.
8. The method of claim 1, wherein the first device die is bonded to the interposer wafer through hybrid bonding, with a first dielectric layer in the first device die bonded to a second dielectric layer in the interposer wafer through fusion bonding, and a first metallic feature in the first device die bonded to a second metallic feature in the interposer wafer through direct metal bonding.
9. A method comprising:
   forming a first package comprising:
      bonding a first device die and a second device die to an interposer die;
      encapsulating the first device die and the second device die in inorganic gap-fill materials;
      forming through-vias on metal pads of the interposer die, wherein the through-vias penetrate through the inorganic gap-fill materials, and are electrically connect to the first device die and the second device die through the interposer die;
      forming a first low-k dielectric layer over the first device die, the second device die, and the through-vias;
      forming metal features in the first low-k dielectric layer, wherein the metal features are formed using a damascene process;
      forming a polymer layer over the metal features, wherein all dielectric materials underlying the polymer layer are inorganic materials, wherein the polymer layer is in physical contact with the first low-k dielectric layer; and
      forming an electrical connector over the polymer layer; and
   bonding the first package to a second package, wherein the electrical connector is bonded to the second package.
10. The method of claim 9, wherein the encapsulating the first device die and the second device die comprises:
   depositing an etch stop layer contacting the first device die, the second device die, and the interposer die;
   forming a dielectric material over the etch stop layer; and
   planarizing the dielectric material.
11. The method of claim 9, wherein the first device die and the second device die are bonded to the interposer die through hybrid bonding.
12. The method of claim 9, wherein the interposer die comprises a second low-k dielectric layer, and the first low-k dielectric layer and the second low-k dielectric layer are on opposite sides of the inorganic gap-fill materials.
13. A method comprising:
   forming a first package comprising:
      forming a first interconnect structure, wherein the first interconnect structure is free from polymers therein;

bonding a device die over the first interconnect structure;
disposing a dielectric region, with the device die being in the dielectric region, wherein the disposing the dielectric region comprises:
   after the device die is bonded, depositing a dielectric liner contacting the first interconnect structure and sidewalls of the device die;
   depositing a dielectric material on the dielectric liner; and
   forming a second interconnect structure over the device die and the dielectric region, wherein the second interconnect structure comprises a polymer layer; and
bonding a second package to the first package through solder region.

14. The method of claim 13, wherein the polymer layer is between the device die and the second package, and the method further comprises, before the polymer layer is formed, depositing a low-k dielectric layer contacting the dielectric region.

15. The method of claim 13 further comprising dispensing an underfill between the first package and the second package, wherein the polymer layer is in contact with the underfill.

16. The method of claim 13, wherein the forming the first interconnect structure comprises a damascene process.

17. The method of claim 13, wherein the forming the second interconnect structure comprises:
depositing the polymer layer;
forming an opening in the polymer layer; and
plating a redistribution line comprising a via portion extending into the opening, and a line portion over the polymer layer.

18. The method of claim 13, wherein the second package is on a first side of the device die, and after the bonding, all portions of the first package on a second side of the device die are free from polymers, and the first side and the second side are opposing sides of the device die.

19. The method of claim 9, wherein the encapsulating the first device die and the second device die in the inorganic gap-filling materials comprises:
depositing a silicon nitride layer; and
depositing a silicon oxide layer over the silicon nitride layer.

20. The method of claim 19, wherein the silicon nitride layer is deposited using a conformal deposition process.

* * * * *